United States Patent
Nazarian et al.

(10) Patent No.: US 9,698,201 B2
(45) Date of Patent: Jul. 4, 2017

(54) HIGH DENSITY SELECTOR-BASED NON VOLATILE MEMORY CELL AND FABRICATION

(71) Applicant: Crossbar, Inc., Santa Clara, CA (US)

(72) Inventors: Hagop Nazarian, San Jose, CA (US); Sung Hyun Jo, Sunnyvale, CA (US); Harry Yue Gee, Milpitas, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/795,105

(22) Filed: Jul. 9, 2015

(65) Prior Publication Data

US 2016/0268341 A1    Sep. 15, 2016

Related U.S. Application Data

(63) Continuation-in-part of application No. 14/717,185, filed on May 20, 2015, and a continuation-in-part of application No. 14/726,071, filed on May 29, 2015.
(Continued)

(51) Int. Cl.
*H01L 27/24* (2006.01)
*H01L 29/423* (2006.01)
(Continued)

(52) U.S. Cl.
CPC ........ *H01L 27/2463* (2013.01); *G11C 13/003* (2013.01); *G11C 13/004* (2013.01);
(Continued)

(58) Field of Classification Search
CPC ............. H01L 27/2436; H01L 27/2463; H01L 27/10823; H01L 29/4236; H01L 45/1233; G11C 13/004
See application file for complete search history.

(56) References Cited

U.S. PATENT DOCUMENTS 6,849,891 B1    2/2005  Hsu et al.
6,855,975 B2    2/2005  Gilton
(Continued)

FOREIGN PATENT DOCUMENTS

CN    1506972 A    6/2004
CN    101501850    8/2009
(Continued)

OTHER PUBLICATIONS

Japanese Office Action dated Aug. 2, 2016 for Japanese Application No. 2015-102280, 13 pages (including translation).
(Continued)

*Primary Examiner* — Allison P Bernstein
(74) *Attorney, Agent, or Firm* — Amin, Turocy & Watson, LLP

(57) ABSTRACT

A high density non-volatile memory device is provided that uses one or more volatile elements. In some embodiments, the non-volatile memory device can include a resistive two-terminal selector that can be in a low resistive state or a high resistive state depending on the voltage being applied. A deep trench MOS ("metal-oxide-semiconductor") transistor having a floating gate with small area relative to conventional devices can be provided, in addition to a capacitor or transistor acting as a capacitor. A first terminal of the capacitor can be connected to a voltage source, and the second terminal of the capacitor can be connected to the selector device. The small area floating gate of the deep trench transistor can be connected to the other side of the selector device, and a second transistor can be connected in series with the deep trench transistor.

20 Claims, 15 Drawing Sheets

Related U.S. Application Data

(60) Provisional application No. 62/022,594, filed on Jul. 9, 2014.

(51) Int. Cl.
  *H01L 49/02* (2006.01)
  *H01L 45/00* (2006.01)
  *H01L 29/66* (2006.01)
  *G11C 13/00* (2006.01)
  *G11C 14/00* (2006.01)

(52) U.S. Cl.
  CPC .......... *G11C 13/0069* (2013.01); *G11C 14/00* (2013.01); *G11C 14/0045* (2013.01); *H01L 27/2436* (2013.01); *H01L 28/60* (2013.01); *H01L 29/4236* (2013.01); *H01L 29/42372* (2013.01); *H01L 29/66613* (2013.01); *H01L 45/1233* (2013.01); *H01L 45/1253* (2013.01); *H01L 45/145* (2013.01); *H01L 45/148* (2013.01); *H01L 45/1608* (2013.01); *G11C 2213/53* (2013.01); *G11C 2213/79* (2013.01)

(56) References Cited

U.S. PATENT DOCUMENTS

| | | | |
|---|---|---|---|
| 7,176,530 B1 | 2/2007 | Bulucea et al. | |
| 7,187,577 B1 | 3/2007 | Wang et al. | |
| 7,274,064 B2* | 9/2007 | Bertin | B82Y 10/00 |
| | | | 257/315 |
| 7,280,390 B2 | 10/2007 | Kostylev et al. | |
| 7,368,752 B2 | 5/2008 | Luyken et al. | |
| 7,388,775 B2 | 6/2008 | Bedeschi et al. | |
| 7,579,612 B2 | 8/2009 | Tang et al. | |
| 7,704,788 B2 | 4/2010 | Youn et al. | |
| 7,786,464 B2 | 8/2010 | Nirschl et al. | |
| 7,791,060 B2 | 9/2010 | Aochi et al. | |
| 7,829,875 B2 | 11/2010 | Scheuerlein | |
| 7,830,698 B2 | 11/2010 | Chen et al. | |
| 7,835,174 B2 | 11/2010 | Tokiwa | |
| 7,859,884 B2 | 12/2010 | Scheuerlein | |
| 7,881,097 B2 | 2/2011 | Hosomi et al. | |
| 7,897,953 B2 | 3/2011 | Liu | |
| 7,920,412 B2 | 4/2011 | Hosotani et al. | |
| 7,924,138 B2 | 4/2011 | Kinoshita et al. | |
| 7,961,506 B2 | 6/2011 | Liu | |
| 8,004,882 B2 | 8/2011 | Katti et al. | |
| 8,018,760 B2 | 9/2011 | Muraoka et al. | |
| 8,045,364 B2 | 10/2011 | Schloss et al. | |
| 8,067,815 B2 | 11/2011 | Chien et al. | |
| 8,102,698 B2 | 1/2012 | Scheuerlein | |
| 8,164,948 B2 | 4/2012 | Katti et al. | |
| 8,218,350 B2 | 7/2012 | Kozicki | |
| 8,278,170 B2 | 10/2012 | Lee et al. | |
| 8,320,160 B2* | 11/2012 | Nazarian | G11C 13/0007 |
| | | | 365/148 |
| 8,329,537 B2 | 12/2012 | Kim et al. | |
| 8,351,241 B2 | 1/2013 | Lu et al. | |
| 8,369,139 B2 | 2/2013 | Liu et al. | |
| 8,411,485 B2* | 4/2013 | Nazarian | G11C 14/0045 |
| | | | 365/148 |
| 8,502,185 B2 | 8/2013 | Lu et al. | |
| 8,587,050 B2 | 11/2013 | Ohba | |
| 8,659,933 B2 | 2/2014 | Jo | |
| 8,735,247 B2 | 5/2014 | Yoo et al. | |
| 8,767,441 B2 | 7/2014 | Lu et al. | |
| 8,993,397 B2 | 3/2015 | Herner | |
| 9,023,719 B2 | 5/2015 | Pachamuthu et al. | |
| 9,305,624 B2 | 4/2016 | Shepard | |
| 2004/0170040 A1 | 9/2004 | Rinerson et al. | |
| 2006/0097238 A1 | 5/2006 | Breuil et al. | |
| 2006/0231910 A1 | 10/2006 | Hsieh et al. | |
| 2007/0268744 A1 | 11/2007 | Taguchi | |
| 2008/0192531 A1 | 8/2008 | Tamura et al. | |
| 2009/0014707 A1 | 1/2009 | Lu et al. | |
| 2009/0122592 A1 | 5/2009 | Tokiwa | |
| 2009/0231910 A1 | 9/2009 | Liu et al. | |
| 2010/0124093 A1 | 5/2010 | Shiga et al. | |
| 2010/0157656 A1 | 6/2010 | Tsuchida | |
| 2010/0176367 A1 | 7/2010 | Liu | |
| 2010/0237314 A1 | 9/2010 | Tsukamoto et al. | |
| 2010/0243983 A1 | 9/2010 | Chiang et al. | |
| 2010/0252909 A1 | 10/2010 | Nakanishi et al. | |
| 2011/0033967 A1 | 2/2011 | Lutz et al. | |
| 2011/0089391 A1 | 4/2011 | Mihnea et al. | |
| 2011/0149639 A1 | 6/2011 | Carter et al. | |
| 2011/0305065 A1 | 12/2011 | Nazarian et al. | |
| 2011/0310656 A1 | 12/2011 | Kreupl et al. | |
| 2012/0007035 A1 | 1/2012 | Jo et al. | |
| 2012/0044751 A1 | 2/2012 | Wang et al. | |
| 2012/0112156 A1 | 5/2012 | Park et al. | |
| 2012/0122290 A1 | 5/2012 | Nagashima | |
| 2012/0132971 A1 | 5/2012 | Mikasa | |
| 2012/0176831 A1 | 7/2012 | Xiao et al. | |
| 2012/0187410 A1 | 7/2012 | Yamazaki et al. | |
| 2012/0211719 A1 | 8/2012 | Haimoto et al. | |
| 2012/0236650 A1 | 9/2012 | Nazarian | |
| 2012/0250395 A1 | 10/2012 | Nodin | |
| 2012/0305879 A1 | 12/2012 | Lu et al. | |
| 2012/0314472 A1 | 12/2012 | Chung | |
| 2013/0264534 A1 | 10/2013 | Hwang et al. | |
| 2013/0313508 A1 | 11/2013 | Kawasaki | |
| 2013/0334593 A1 | 12/2013 | Seol et al. | |
| 2014/0063903 A1 | 3/2014 | Chang et al. | |
| 2014/0092669 A1 | 4/2014 | Chen et al. | |
| 2014/0112058 A1 | 4/2014 | Kellam et al. | |
| 2014/0231740 A1 | 8/2014 | Ohba | |
| 2014/0284544 A1 | 9/2014 | Miyagawa et al. | |
| 2014/0292365 A1 | 10/2014 | Said | |
| 2015/0070966 A1 | 3/2015 | Bandyopadhyay et al. | |
| 2015/0076579 A1 | 3/2015 | Tsuji et al. | |
| 2015/0179662 A1 | 6/2015 | Makala et al. | |
| 2016/0104715 A1 | 4/2016 | Pachamuthu et al. | |
| 2016/0204117 A1 | 7/2016 | Liu et al. | |
| 2016/0211386 A1 | 7/2016 | Tomai et al. | |
| 2016/0268341 A1 | 9/2016 | Nazarian et al. | |

FOREIGN PATENT DOCUMENTS

| | | |
|---|---|---|
| CN | 102986048 A | 3/2013 |
| CN | 103682091 A | 3/2014 |
| JP | 2001249324 A | 9/2001 |
| JP | 2008277543 A | 11/2008 |
| JP | 2009267185 A | 11/2009 |
| JP | 2010009669 A | 1/2010 |
| JP | 2010087007 A | 4/2010 |
| JP | 2010519762 A | 6/2010 |
| JP | 2010186872 A | 8/2010 |
| JP | 201123645 | 2/2011 |
| JP | 2011129639 A | 6/2011 |
| JP | 2014036034 A | 2/2014 |
| TW | 201214673 A | 4/2012 |
| WO | 2011005266 | 1/2011 |
| WO | 2013052321 A2 | 4/2013 |

OTHER PUBLICATIONS

Taiwanese Office Action dated Aug. 19, 2016 for Taiwanese Application No. 104107381, 7 pages (including translation).
Japanese Office Action dated Aug. 9, 2016 for Japanese Application No. 2015-137033, 6 pages (including translation).
Notice of Allowance dated Oct. 20, 2016 for U.S. Appl. No. 15/066,504, 28 pages.
Taiwanese Office Action dated Aug. 11, 2016 for Taiwanese Application No. 104121989, 10 pages (including translation).
Taiwanese Office Action dated Oct. 19, 2016 for Taiwanese Application No. 104122122, 7 pages (including translation).
Office Action dated Dec. 15, 2016 for U.S. Appl. No. 14/726,071, 62 pages.
Wolf, "Silicon Processing for the VLSI Era vol. 3: The Submicron Mosfet", Lattice Press, 1995, pp. 200-201.
Office Action dated Dec. 22, 2016 for U.S. Appl. No. 14/641,466, 45 pages.

(56) References Cited

OTHER PUBLICATIONS

Office Action dated Dec. 29, 2016 for U.S. Appl. No. 15/195,417, 38 pages.
Wouters, "Scaling challenges for 2-terminal select devices," ITRS ERD Selector Workshop, Apr. 2012, 41 pages, IMEC, Noorderwijk, NL.
Office Action dated May 27, 2015 for U.S. Appl. No. 14/588,185, 23 pages.
Office Action dated Dec. 6, 2013 for U.S. Appl. No. 13/960,735, 19 Pages.
Office Action dated Jun. 19, 2012 for U.S. Appl. No. 13/149,757, 11 Pages.
International Search Report and Written Opinion for PCT Application No. PCT/US2015/17370 mailed Jul. 13, 2015, 17 pages.
Chinese Office Action dated Nov. 23, 2015 for Chinese Patent Application No. 201280027066.9, 12 pages (including translation).
Office Action dated Oct. 3, 2013 for U.S. Appl. No. 13/921,157, 10 pages.
International Search Report and Written Opinion for PCT Application No. PCT/US20121040232 mailed Feb. 26, 2013, 9 pages.
Office Action dated May 7, 2013 for U.S. Appl. No. 13/585,759, 12 pages.
Office Action dated May 23, 2013 for U.S. Appl. No. 13/592,224, 9 pages.
Notice of Allowance dated Sep. 19, 2013 for U.S. Appl. No. 13/585,759, 9 pages.
Office Action dated Dec. 6, 2013 for U.S. Appl. No. 13/960,735, 10 pages.
International Search Report and Written Opinion for PCT Application No. PCT/US2013/054976 mailed Dec. 16, 2013, 9 pages.
Notice of Allowance dated Jul. 22, 2015 for U.S. Appl. No. 14/612,025, 11 pages.
Office Action dated Jul. 14, 2016 for U.S. Appl. No. 14/793,392, 28 pages.
Office Action dated Jul. 13, 2016 for U.S. Appl. No. 14/755,998, 22 pages.
Office Action dated Aug. 3, 2015 for U.S. Appl. No. 14/717,185, 26 pages.
Office Action dated Jul. 6, 2016 for U.S. Appl. No. 14/726,071, 25 pages.
Korean Office Action dated Mar. 6, 2017 for Korean Application No. 10-2015-0097600, 5 pages (including English translation).
Chinese Office Action dated Dec. 27, 2016 for Chinese Patent Application No. 201510105630.X, 16 pages (including English translation).
Japanese Office Action dated Mar. 7, 2017 for Japanese Application Serial No. JP2015-102280, 6 pages (including English translation).
Korean Office Action dated Feb. 27, 2017 for Korean Application No. 10-2015-0096673, 7 pages (including English translation).
Office Action dated Mar. 30, 2017 for U.S. Appl. No. 14/726,071, 64 pages.

\* cited by examiner

HIGH DENSITY SELECTOR-BASED NON VOLATILE MEMORY CELL AND FABRICATION

REFERENCE TO RELATED APPLICATIONS

The present application for patent is a continuation-in-part of U.S. patent application Ser. No. 14/717,185 entitled "NON-VOLATILE MEMORY CELL UTILIZING VOLATILE SWITCHING TWO TERMINAL DEVICE AND A MOS TRANSISTOR" and filed May 20, 2015, which claims the benefit of U.S. Provisional Patent Application Ser. No. 62/022,594 entitled "NON-VOLATILE MEMORY CELL UTILIZING VOLATILE SWITCHING TWO TERMINAL DEVICE AND A MOS TRANSISTOR" and filed Jul. 9, 2014, and is a continuation-in-part of U.S. patent application Ser. No. 14/726,071 entitled "RECESSED HIGH VOLTAGE METAL OXIDE SEMICONDUCTOR TRANSISTOR FOR RRAM CELL" and filed May 29, 2015, the disclosures of which are incorporated herein by reference in their respective entireties and for all purposes. The present application for patent is related to U.S. Non-Provisional patent application Ser. No. 14/588,185, entitled "Selector Device for Two-Terminal Memory" and filed Dec. 31, 2014, the entirety of which is incorporated by reference herein for all purposes. U.S. Non-Provisional application Ser. No. 11/875,541 filed Oct. 19, 2007 and application Ser. No. 12/575,921 filed Oct. 8, 2009, are also incorporated by reference herein in their respective entireties and for all purposes.

TECHNICAL FIELD

The subject disclosure relates generally to non-volatile memory, and as one illustrative example, a non-volatile memory cell utilizing a volatile resistive switching device and MOS transistor.

BACKGROUND

The inventor(s) of the present disclosure have proposed models of two-terminal memory devices that he expects to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventor(s) to provide some potential advantages over purely non-volatile FLASH MOS type transistors, including smaller die size, higher memory density, faster switching (e.g., from a relatively conductive state to a relatively non-conductive state, or vice versa), good data reliability, low manufacturing cost, fabrication-compatible processes, and other advantages, for example.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure, in various embodiments thereof, provides a high-speed non-volatile memory structure, comprising a volatile resistive switching device and a metal oxide semiconductor (MOS) transistor. In particular embodiments, the memory structure can be fabricated with a low profile gate structure for the MOS transistor, facilitating high memory densities of the non-volatile memory structure in an array of such structures. Further embodiments disclose a process for fabricating at least a subset of disclosed non-volatile memory structures.

In one or more embodiments, the subject disclosure provides a method for fabricating a memory device. The method can comprise providing a substrate for the memory device and forming a transistor at least in part within the substrate having a transistor gate. Further, the method can comprise forming a metal interconnect in electrical contact with the transistor gate and forming a volatile, two-terminal switching device comprising a first conductive terminal in electrical contact with the metal interconnect, a volatile resistive-switching selector layer overlying the first conductive terminal, and a second conductive terminal overlying the volatile resistive-switching selector layer. In addition to the foregoing, the method can comprise forming a capacitor having a first terminal electrically connected to the second conductive terminal of the volatile, two-terminal switching device and a second terminal configured to receive an input signal.

In further embodiments, the present disclosure provides a memory device comprising a transistor formed at least in part within a dielectric layer or substrate of a memory structure, the transistor having a gate with a width less than about 100 nanometers (nm). The memory device can further comprise a volatile selector device comprising a first metal contact, a volatile switching layer and a second metal contact, wherein the first metal contact is in electrical contact with the gate of the transistor. Additionally, the memory device can comprise a capacitor structure having a first terminal in electrical contact with the second metal contact of the volatile selector device and a second terminal in electrical contact with a signal input.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
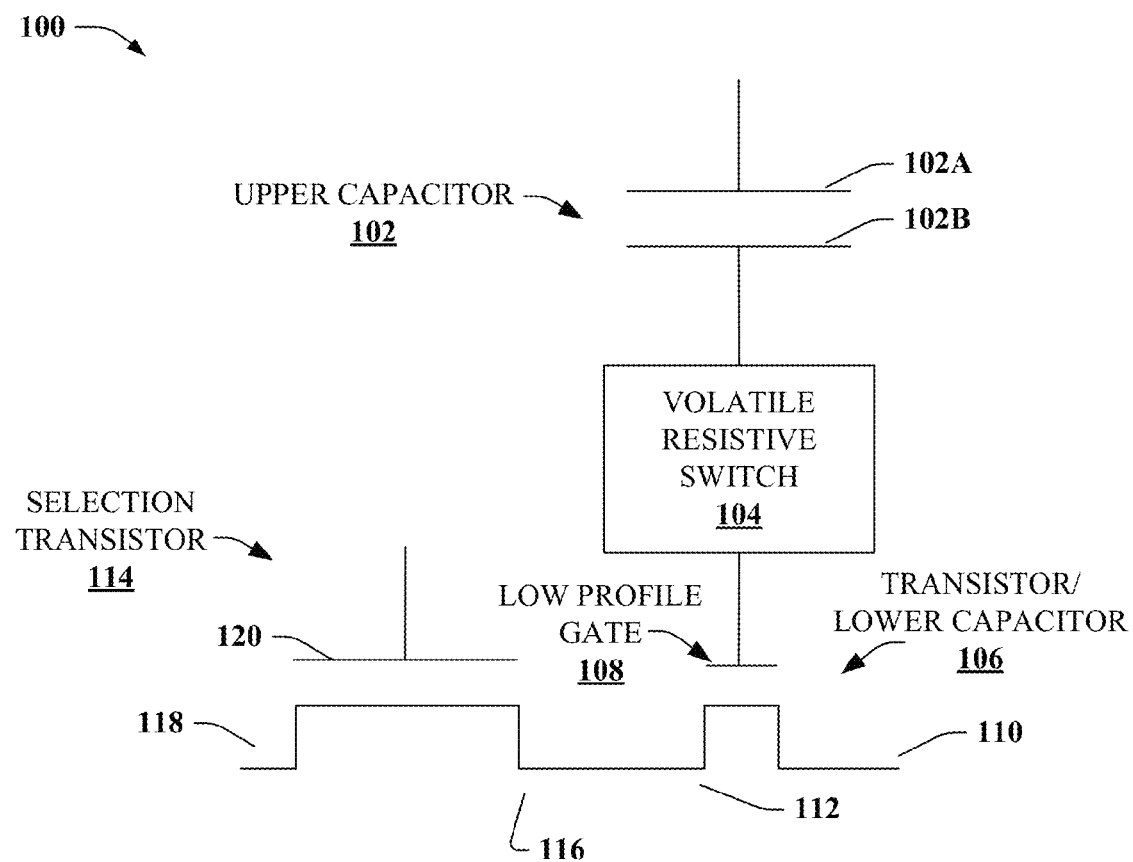
FIG. 1 illustrates a schematic diagram of an example non-volatile memory cell with a volatile element and improved cell density, in various embodiments.

This disclosure relates to a non-volatile memory device comprising one or more volatile elements. In some embodiments, the non-volatile memory device can include a resistive two-terminal selector device that can be in a low resistive state or a high resistive state in response to respective voltages, or respective ranges of voltages, applied to the resistive two-terminal selector device. The selector device can be a volatile switching device with multiple thresholds (or narrow threshold ranges) (e.g., a positive threshold and a negative threshold). In various embodiments, the selector device is a resistive switching device, or a field induced superlinear threshold (FAST™) switching device (or selector device) under development by the assignee of the present invention. In addition to the resistive two-terminal selector device, the non-volatile memory device can include a capacitor structure and a MOS ("metal-oxide-semiconductor") transistor (which can act or operate as an additional capacitor, in at least some disclosed embodiments). A first terminal of the capacitor can be coupled to a voltage source, and the second terminal of the capacitor can be coupled to a first selector terminal of the selector device. In one or more embodiments, the MOS transistor can be an NMOS transistor comprising a floating gate connected to a second selector terminal of the selector device. Electrical conductivity between a source and drain of the NMOS transistor is modulated by a charge magnitude stored on the MOS transistor gate which is floating (e.g., typically not connected to a power source) during read operation. In one or more additional embodiments a second NMOS transistor can be provided having a source or drain connected in series with the source/drain of the first NMOS transistor.

In various embodiments, a disclosed volatile selector device can be a filamentary-based device. One example of a filamentary-based device can comprise: a first conductive layer, e.g., metal bearing layer (e.g. TiN, TaN, Cu, Al, Ag, or alloy thereof, etc.), doped p-type (or n-type) silicon (Si) bearing layer (e.g., p-type or n-type polysilicon, p-type or n-type polycrystalline SiGe, etc.); a resistive switching layer (RSL); and a second conductive layer (e.g. a material selected from the list described for the first conductive layer). Under suitable bias conditions, conductive ions form within the first conductive layer, and the first conductive layer provides conductive ions to the RSL. In various embodiments, a bias may be an applied voltage exceeding a magnitude of a threshold voltage (e.g. an applied voltage exceeding a positive threshold voltage). In various embodiments, the conductive ions become neutral metal particles below the magnitude of the threshold voltage (e.g., at a lower voltage magnitude) and form a conductive filament within the RSL that can facilitate electrical conductivity through at least a subset of the RSL. In some embodiments, the resistance of the filament-based device can then be determined by a tunneling resistance between the filament and the second conductive layer (or by an inherent resistivity of a conductive short through the RSL (e.g., formed by the metal particles forming the filament within the RSL)).

In the absence of the bias, the conductive filament can at least in part deform, breaking electrical continuity of the conductive filament. This can result from a surface energy of the metal particles exceeding stabilizing influences keeping the particles in place (e.g., surface tension of surrounding molecules, voids/defects/trapping sites within the RSL, an ionizing electric field, etc.) resulting in particle diffusion within the RSL. This particle diffusion can then break the continuity of the conductive filament, restoring the RSL to an intrinsic high resistance state.

According to further embodiments, the second conductive layer can also comprise neutral metal particles capable of being ionized. In such embodiments, the second conductive layer can form metal ions and provide the metal ions to the RSL in response to a second suitable bias condition(s). In various embodiments, a bias may be an applied voltage exceeding a magnitude of a threshold voltage (e.g. an applied voltage less than a negative threshold voltage). Under suitable conditions, conductive ions are formed within the second conductive layer and depending upon bias conditions, the second conductive layer provides conductive ions to the RSL. In such embodiments, the conductive ions form neutral metal particles, below the bias, and form a conductive filament within the RSL that can facilitate electrical conductivity through at least a subset of the RSL. The resistance of the filament-based device can then be determined by a tunneling resistance between the filament and the first conductive layer (or by an inherent resistivity of a conductive short through the RSL (e.g., formed by the ions forming the filament within the RSL)).

In various embodiments, if an applied voltage is about zero, e.g. ground, conductive filaments are not appreciably formed within the RSL. Accordingly, the resistance of the RSL layer is substantially higher than when the above embodiments are under the bias conditions described above.

A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a non-zero value less than 2), and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number), a non-stoichiometric silicon-bearing material, a non-stoichiometric metal oxide, and so forth, or a suitable combination thereof. In various embodiments, the RSL includes few or a low number of material voids or defects which can trap conductive particles; accordingly, in some embodiments, the conductive particles have relatively good diffusive or drift mobility within the RSL, or can quickly form a very narrow continuous filament in response to a suitable threshold bias, or a combination of the foregoing.

In various disclosed embodiments, filamentary-based switching devices are disclosed and their operation is described. In some embodiments, a filamentary-based switching device can be a volatile switching device, which exhibits a first measurably distinct state in the absence of a suitable external stimulus (or stimuli), and exhibits a second measurably distinct state in response to the suitable external stimulus (or stimuli). The volatile filamentary-based switching device is often referred to herein as a selector device, or selection device, filamentary selector device, filamentary-based selector device, and so on; though such devices, their composition or application should not be limited by this terminology. In various embodiments, a filamentary selector device is provided in a circuit to facilitate formation of a non-volatile memory cell, having very fast performance. In some embodiments, the non-volatile memory cell can have a read performance less than 20 nanoseconds (ns), less than 10 nanoseconds, or between 1 ns and 5 ns, in various embodiments. In various embodiments, a selector device developed by the assignee of the present invention, under the trademarks Field Assisted Superliner Threshold™ or FAST™, is utilized.

A filamentary selector device according to various disclosed embodiments can exhibit a first state (e.g., a first electrical resistance, or other suitable measurable characteristic) in the absence of a suitable external stimulus (or stimuli). The stimulus (or stimuli) can have a threshold value or range of such values that induces the filamentary selector device to change from the first state to a second state while the stimulus is applied. In response to the stimulus falling below the threshold value (or outside of the threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), or switching in response to the same or similar magnitude of threshold stimulus, or range thereof, (though of opposite polarity or direction), or the like. In other embodiments, the third state can be distinct from the second state, either in terms of the measurable characteristic (e.g., different reverse electrical conductivity value in response to the reverse polarity as compared to a forward electrical conductivity value in response to the forward polarity) or in terms of threshold stimulus associated with transitioning out of the first state (e.g., a different magnitude of positive voltage required to transition to the second state, compared to a magnitude of negative voltage required to transition to the third state).

In other embodiments, the selector device may be a unipolar device, having a single threshold voltage. When an applied voltage, at least between ground and the threshold voltage is applied, the selector device has a high characteristic resistance. Further, when the applied voltage has a magnitude greater than the threshold voltage (e.g. more positive than a positive threshold voltage, or more negative than a negative threshold voltage), the selector device has a low characteristic resistance. In some embodiments, two unipolar devices may be placed in parallel, with opposite polarity. It is expected that such a configuration of unipolar devices would provide a characteristic response similar to the bipolar selector device, described above.

As stated above, a disclosed filamentary based selector device can form a conductive path or filament through a relatively high resistive portion in response to a suitable external stimulus (or range of stimulus). The external stimulus (or stimuli) can cause metallic particles within a terminal of the selector device (e.g., active metal layer terminal, conductive layer terminal, etc.) to migrate within (or ionize within) a RSL layer of the filamentary selector device. Further, the RSL can be selected to have relatively few physical defect locations for the volatile filamentary switching device, facilitating relatively good mobility of the metallic particles within the RSL, formation of a very narrow (e.g., only a few particles wide, or less) conductive filament, or the like, or a combination of the foregoing. Accordingly, with respect to a forward direction and positive polarity stimulus, below an associated positive threshold stimulus (or narrow range of positive threshold values), the metallic particles can disperse within the RSL, resisting or avoiding formation of a sufficient conductive path through the RSL to lower a high resistance associated with the first state. Above the threshold, the external stimulus maintains the metallic particles in sufficient formation to provide the conductive path, leading to relatively low resistance of the second state. An analogous mechanism can control operation of the third state (in a reverse direction and reverse polarity stimulus) in the bipolar context.

Overview

The volatile element of disclosed non-volatile memory cells, the selector device, can have a low resistance state and a high resistance state based on the voltage being applied by the voltage source to the first terminal of the capacitor. Between a range of deactivation voltages (e.g., from a negative threshold voltage to a positive threshold voltage, or other suitable positive range, negative range, or range spanning positive and negative voltages) the resistance can be very high, whereas outside the range of deactivation voltages, the resistance can be much lower, facilitating current flow (and charge transfer) across the selector device. As a magnitude of voltage across the selector device, starting within the range of deactivation voltages, is increased (e.g., increasing with time), charge first accumulates very slowly on the gate of the MOS transistor connected to a second terminal of the selector device. Once the magnitude of the voltage leaves the range of deactivation voltages and exceeds a first threshold voltage (e.g., a positive threshold, or a narrow range of positive threshold voltages), the selector device enters the low resistance state and conducts current to the gate of the MOS transistor, enabling charge to accumulate much more quickly on the gate of the MOS transistor. As the voltage decreases below the positive threshold (or narrow range of positive threshold voltages), the selector device enters the high resistance state and becomes non-conductive. The non-conductivity of the selector device serves to trap charge that accumulated at the gate of the MOS transistor, as stated above. When the voltage source returns to zero, the charge trapped at the gate of the MOS transistor can still remain, resulting in a measurable potential difference greater than zero (e.g., about 0.5 volts, about 0.75 volts, about 1 volt, or any other suitable voltage measurably distinct from zero). This trapped measurable charge can cause the MOS transistor to be in a second state, different from a first state in which less charge is trapped at the gate of the MOS transistor. The two states of the MOS transistor provide a bit of non-volatile storage.

In an erase cycle, a decreasing negative voltage is applied, and while the selector device is in a high resistance state, charge at the gate of the MOS transistor decreases slowly. Once the selector device switches to the low resistance state, the charge decreases more rapidly with decreasing negative voltage. The selector device switching to the low resistance state occurs when the decreasing negative voltage again leaves the range of deactivation voltages (e.g., drops below a negative threshold voltage, or narrow range of negative threshold voltages). The positive charge generated by the positive voltage (described above) decreases rapidly (e.g., is replaced by a negative charge in some embodiments) and changes a state of the MOS transistor from the second state back to the first state. In some embodiments, negative charge accumulates quickly with the selector device in the low resistance state, and then as the applied voltage returns to zero and the selector device returns to the high resistant state, a negative charge remains accumulated on the gate of the MOS transistor. Since the current leakage of the selector device can be very low (e.g., measured in atto-amps in at least some disclosed embodiments), the charge on the gate of the MOS transistor can retain a magnitude suitable to maintain the changed state of the MOS transistor for a long period of time. These two different stable states of positive charge and negative charge accumulation on the gate of the MOS transistor provide non-volatile characteristics for the disclosed memory cells.

Non-Limiting Examples a Non-Volatile Memory Cell Utilizing Volatile Switching Two Terminal Device and a MOS Transistor Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring now to the drawings, in FIG. 1 illustrated is a schematic diagram of an example non-volatile memory cell 100 with a volatile element in accordance with various aspects described herein. Non-volatile memory cell 100 can include a volatile resistive switch 104 (e.g., a resistive two-terminal selector device) that can be in a low resistive state or a high resistive state depending on the voltage being applied. A capacitor 102 with a first terminal 102A and a second terminal 102B connected to the volatile resistive switch 104 can also be provided. A first MOS transistor 106 (e.g., an NMOS transistor, or other suitable MOS transistor) can serve as a lower capacitor for non-volatile memory cell 100. First MOS transistor 106 can comprise a low-profile gate 108 connected to the volatile resistive switch 104, a source 110, and a drain 112. In an embodiment, the drain 112 can also be connected in series with a source 116 of a selection transistor 114 that includes a gate 120, the source 116 and a drain 118. In an embodiment, selection transistor 114 can also be a deep trench transistor having a low-profile gate, similar to low-profile gate 108 of first MOS transistor 106. As an example, a deep trench transistor employed for low capacitor 406 of FIG. 4, infra, or deep trench transistor 502 of FIG. 5, infra, (or devices 1300, 1400 of FIGS. 13 and 14, respectively, or other suitable deep trench transistor) could be utilized for selection transistor 114, in various embodiments.

Volatile resistive switch 104 can be a resistive two-terminal selector device configured to be operable in response to a suitable electric signal applied at one or more of two terminals of volatile resistive switch 104. In various disclosed embodiments, volatile resistive switch 104 can have a non-linear I-V response, in which volatile resistive switch 104 exhibits current within a first range in response to a first range of voltage magnitudes, and current within a second range (e.g., much higher in magnitude than the first range) in response to a second range of voltage magnitudes (e.g., see FIG. 2A, infra). The first range of voltage magnitudes and second range of voltage magnitudes can be distinguished, as one example, by a threshold voltage, or a threshold range of voltages (e.g., having magnitude(s) between the first range of voltage magnitudes and the second range of voltage magnitudes). In various embodiments, volatile resistive switch 104 may be embodied as a Field-Assisted Superlinear Threshold (FAST™) selector device, currently under development by the current assignee of the present patent application and disclosed in U.S. Non-Provisional application Ser. No. 14/588,185 filed Dec. 31, 2014, the entirety of which is incorporated by reference herein for all purposes.

Volatile resistive switch 104 can comprise a top electrode and a bottom electrode. The top electrode and bottom electrode of volatile resistive switch 104 are electrical conductors, and are comprised of materials suitable to facilitate conduction of current. In one or more embodiments, the top electrode and bottom electrode of volatile resistive switch 104 can comprise a material(s) providing or facilitating provision of mobile atoms or ions in response to a suitable stimulus. Examples of suitable stimuli can include an electric field (e.g. a programming voltage), joule heating, a magnetic field, or other suitable stimuli for directed or partially directed particle motion. In an embodiment the memory cell 100 can be formed by back to back-end-of-line metal layers of a semiconductor chip. In another embodiment, the memory cell 100 and circuit can scale below the 20 nm technology size.

Examples of suitable materials for the top electrode or bottom electrode of volatile resistive switch 104 can include a noble metal (e.g., Ag, Pd, Pt, Au, etc.) or a metal alloy containing noble metal in part (e.g., Ag—Al, Ag—Pd—Cu, Ag—W, Ag—Ti, Ag—TiN, Ag—TaN, and so forth). A noble metal or alloy thereof can be utilized to facilitate mitigated interaction between the top electrode or the bottom electrode and a selector layer of selector device 106 situated between the top electrode and the bottom electrode, for instance. This mitigated particle interaction (e.g., mitigating or avoiding chemical bonding of the top electrode particles or the bottom electrode particles with particles of the selector layer of volatile resistive switch 104) can facilitate improved longevity and reliability for volatile resistive switch 104, as one example. Another example of a suitable material for the top electrode or the bottom electrode can include a material with relatively fast diffusing particles. Faster diffusion can include, for instance, a capacity to move among defect sites (e.g., voids or gaps in molecular material) within a solid, e.g., defined by a suitable surface energy, facilitating dispersion of the relatively fast diffusion particles absent a suitable aggregating force, for instance (e.g., an external voltage of greater than a threshold magnitude). Materials with relatively fast diffusing particles can facilitate fast state switching of volatile resistive switch 104 (e.g., from a non-conductive state to a conductive state), at lower bias values. Examples of suitable fast diffusing materials can include Ag, Cu, Au, Co, Ni, Al, Fe, or the like, suitable alloys thereof, or suitable combinations of the foregoing.

In at least one embodiment, the top electrode of volatile resistive switch 104 can be comprised of the same material or substantially the same material as the bottom electrode of volatile resistive switch 104. In other embodiments, the top electrode and bottom electrode can be different materials. In still other embodiments, the top electrode and bottom electrode can be at least in part the same material, and in part different materials. For instance, the top electrode could comprise a suitable conductive material, and the bottom electrode could at least in part comprise an alloy of the suitable conductive material, or the suitable conductive material in combination with another suitable conductor, as an illustrative example.

In addition to the foregoing, volatile resistive switch 104 includes a selector layer disposed between the top electrode and the bottom electrode of volatile resistive switch 104. In contrast to top electrode or bottom electrode, however, the selector layer can be an electrical insulator or ionic conductor. Further, the selector layer can be a material (e.g., an oxide) at least weakly permeable to particles of the top electrode or bottom electrode. In some embodiments, the selector layer can be a non-stoichiometric material. Examples of suitable materials for selector layer 104 can include non-stoichiometric materials, such as: $SiO_X$, $TiO_X$, $AlO_X$, $WO_X$, $Ti_XN_YO_Z$, HfOx, TaOx, NbOx, or the like, or suitable combinations thereof, where x, y and z can be suitable non-stoichiometric values. In some embodiments, the selector layer can be a (doped or undoped) chalcogenide or a solid-electrolyte material containing one or more of Ge, Sb, S, Te. In yet another embodiment, the selector material can comprise a stack of a plurality of the above mentioned materials (e.g. SiOx/GeTe, TiOx/AlOx, and so forth). In at least one embodiment of the present disclosure, the selector layer can be doped with a metal(s) during fabrication, to facilitate metal ion injection from the top or bottom electrode.

In response to a suitable signal applied at non-volatile memory cell 100, volatile resistive switch 104 can transition from a non-conducting state having a high electrical resistance and a first current (or a first range of currents), to a relatively-conducting state having a lower electrical resistance and a second current (or a second range of currents). In various embodiments, a current ratio of the first current to the second current can be at least about 1,000 or more. For instance, in one embodiment, the current ratio can be selected from a range of current ratios from about 1,000 to about 10,000. In another embodiment, the current ratio can be selected from a range of current ratios from about 10,000 to about 100,000. In yet another embodiment, the current ratio can be selected from a range of current ratios from about 100,000 to about 1,000,000. In still other embodiments, the current ratio can be selected from a range of current ratios from about 1,000,000 to about 10,000,000 or more. In a further embodiment, the current ratio can be within a range of current ratios from about 10E9 to about 10E11. Other suitable current ratios can be provided for a selector device 106 in various other suitable embodiments. It is expected with further research, current ratios of up to 10E15 or 10E18 may be obtainable.

Figure 2:
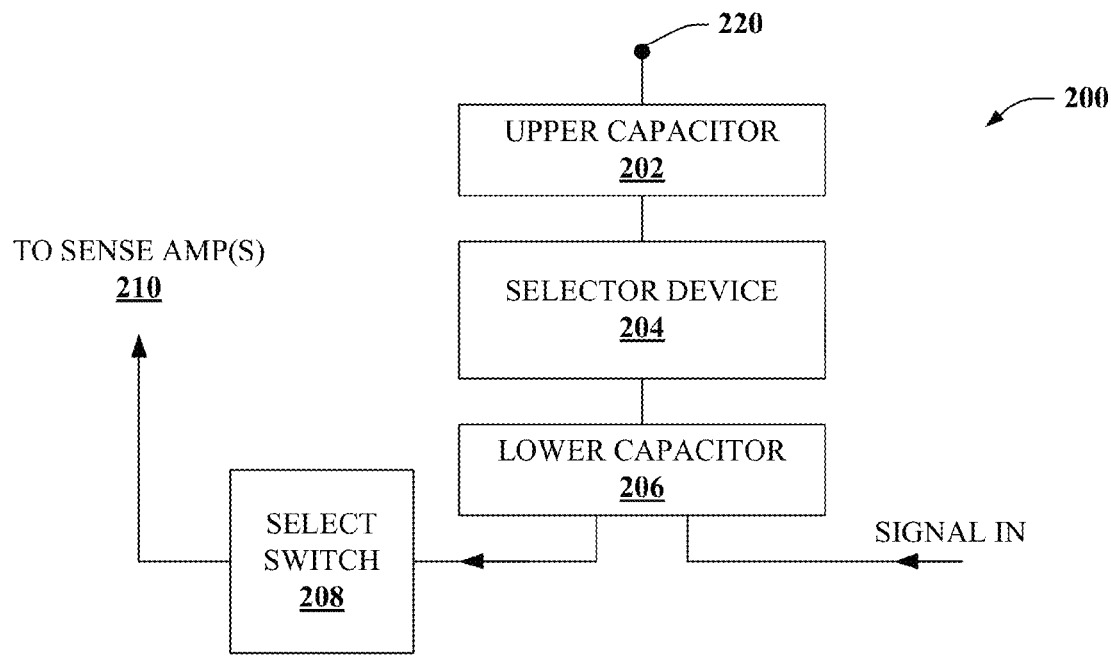
FIGS. 2 and 2A illustrate example block diagram and current-voltage response, respectively, for the example non-volatile cell, in one or more embodiments.
Figure 2A:
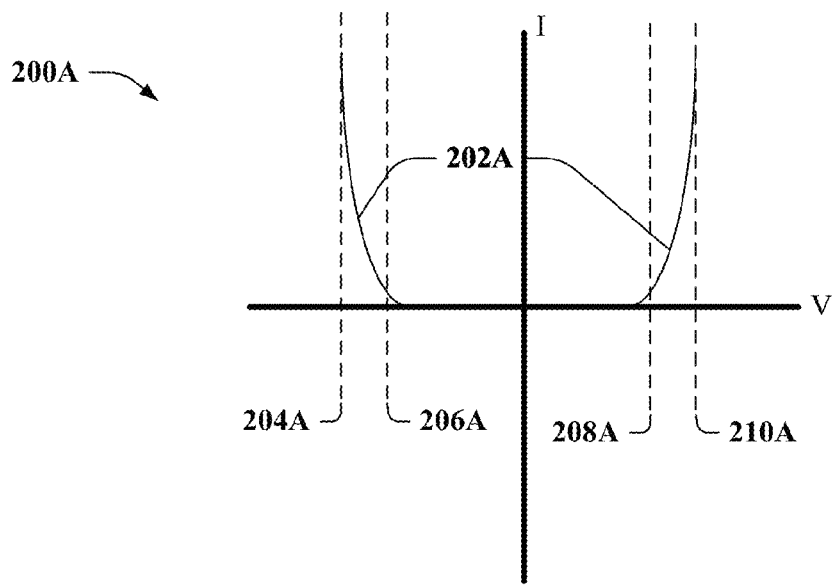

Turning now to FIGS. 2 and 2A, FIG. 2 illustrates a schematic diagram of an example non-volatile memory device 200 comprising a volatile element in accordance with various aspects described herein. Non-volatile memory device 200 can include a resistive two-terminal selector device 204 that can be in a low resistive state or a high resistive state depending on the voltage being applied by a voltage source 220. The voltage source 220 can be coupled to a terminal of an upper capacitor 202 that has a second terminal connected to a top electrode of the selector device 204. A lower capacitor 206 (e.g., a gate of an NMOS transistor, or other suitable transistor) can include a low-profile gate connected to a bottom electrode of the selector device 204, and a source and drain. In an embodiment, the drain can also be connected in series with a select switch 208 (e.g., a second MOS).

The following is an illustrative example, though it should be appreciated that the disclosed voltages are not limiting, and other voltages and ranges of voltages for a selector device 204 can be applicable in addition or instead. According to the example, if the voltage applied by voltage source 220 (or stored at lower capacitor 206) is such that the effective voltage across top and bottom electrodes of selector device 204 is between a negative and positive voltage threshold of about −1.7V to about +1.7V (merely as example voltages), the selector device 204 can be (or remain) in a high resistance state. In the high resistance state, upper capacitor 202, selector device 204 and lower capacitor 206 act in an electrical sense as series capacitors (or approximate a capacitor(s)). Accordingly, voltages dropped across respective ones of the upper capacitor 202, selector device 204 and lower capacitor 206 increase in response to increasing voltage applied by voltage source 220 in proportion to their respective capacitive coupling ratios.

In some embodiments, if the voltage applied across selector device 204 is beyond the range of about −1.7V to about 1.7V, the selector device 204 can enter a low resistance state and will conduct a much larger current (e.g., no longer acting as a capacitor). In contrast, in a high resistance state, an increasing voltage applied by voltage source 220 causes an extremely slowly increasing charge to accumulate at lower capacitor 206 (e.g., because of the high resistivity of selector device 206 in its high resistance state). When the voltage applied across the selector device 204 is outside the above range of about −1.7V to about 1.7V (e.g., Voltage source<∼− 1.7, or Voltage source>∼1.7) and selector device 204 transitions to a low resistance state, the charge at lower capacitor 206 will increase at a similar rate to the increasing potential across the selector device 204. In various embodiments, the positive and negative threshold voltages may be different, e.g. −1.5 v and 1.7 v; −1 v and 1.5 v; −1.1 v and 1.2 v; or the like, depending upon specific configuration.

In various embodiments, after the voltage applied by voltage source 220 peaks and begins to decrease in magnitude, the charge at lower capacitor 206 will decrease in proportion with a decreasing potential across selector device 204. Once the voltage across selector device 206 drops below the threshold of about 1.7V, the selector device 204 enters into a high resistance state again, and the charge dispersion rate at lower capacitor 206 decreases greatly. After the voltage applied by voltage source 220 goes to zero, a portion of the accumulated charge remains at the low-profile gate of lower capacitor 206, suitable to cause current to conduct from the source to the drain thereof. Conductivity (or non-conductivity) of the source and drain of lower capacitor 206 can be measured at sense amp(s) 210 in response to activation of a select switch 208.

In a similar manner, the voltage source 220 can apply a negative voltage to upper capacitor 202 and the charge accumulated at lower capacitor 206 will decrease at a very small rate based on the capacitive ratios of upper capacitor 202, selector device 204 and lower capacitor 206. Once the negative voltage applied across selector device 204 goes below the negative voltage threshold however, and selector device 204 transitions to a low resistance state, charge trapped at the low-profile gate of lower capacitor 206 can decrease (in some embodiments) or accumulate a negative charge (in other embodiments) at a much faster rate.

In some embodiments, as the negative voltage decreases in magnitude toward zero volts, the voltage across selector device 204 increases relative to the negative threshold voltage, and selector device 204 re-enters the high resistance state, and a second charge (e.g., low charge, negative charge, etc.) will remain at the low-profile gate of lower capacitor 206. The trapped charge is typically suitable to cause the source and drain of lower capacitor 206 to be non-conductive, e.g., measurable during a read operation at sense amp(s) 210 enabled by select switch 208.

This cycling of positive and negative voltages is the program and erase cycle of the non-volatile memory device 200, and a read voltage can be applied at the source of lower capacitor 206 to determine whether the source and drain of lower capacitor 206 are conducting (e.g., in the second state) or non-conducting (e.g., in the pre-charge state). Based on a current flowing through select switch 208 measured by sense amp(s) 210, it can be determined whether the memory cell is programmed or erased, for example.

FIG. 2A shows a graph 200A of an I-V response 202A of selector device 204 for a range of positive and negative voltages. The x-axis of the graph represents voltage, and the y-axis of the graph shows current. On the positive x-axis is a lower positive threshold 208A and an upper positive voltage 210A, and on the negative x-axis is a lower negative threshold 206A (in magnitude) and an upper negative voltage 204A (also in magnitude). In between the lower negative threshold 206A and lower positive threshold 208A, very little current is conducted by the selector device 204, and the selector device 204 effectively behaves like a high resistance resistor, or even a capacitor. In the range of negative voltages between 204A and 206A, as well as between positive voltages 208A and 210A, the selector device 204 very quickly transitions to a low resistance state. The ratio of resistances between the high resistance state and the low resistance state can be in the vicinity of $1\times10^7$:1 to $1\times10^{10}$:1, in at least some disclosed embodiments.

In an embodiment, the selector device 204 can begin to transition from a high resistance state to a low resistance state at about −1.7V and about +1.7V (206A and 208A, respectively). The transition can be complete by about −2V and about +2V (204A and 210A, respectively). In other embodiments, the voltage threshold 206A/208A can begin at about ±1.5V, respectively, and the selector device 204 can be fully transitioned into the low resistance state by about ±1.8V (204A/210A, respectively). In still other embodiments, negative voltages 204A/206A and positive voltages 208A/210A can have other respective ranges of voltage values. The magnitudes of the thresholds need not be symmetric (e.g. −1.3 volts and +1.5 volts).

Figure 3:
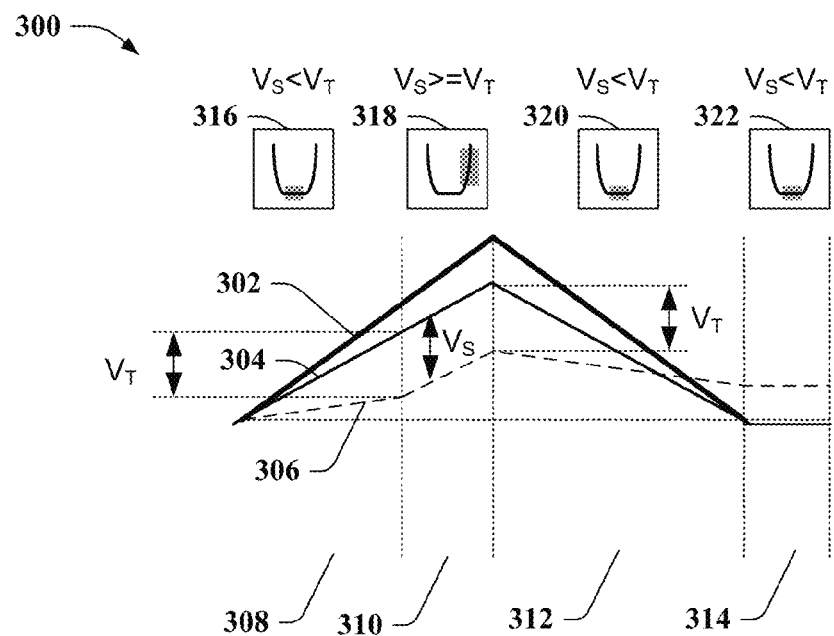
FIGS. 3 and 3A illustrate example graphs showing charge accumulation in the non-volatile memory cell and operation of the volatile element.
Figure 3A:
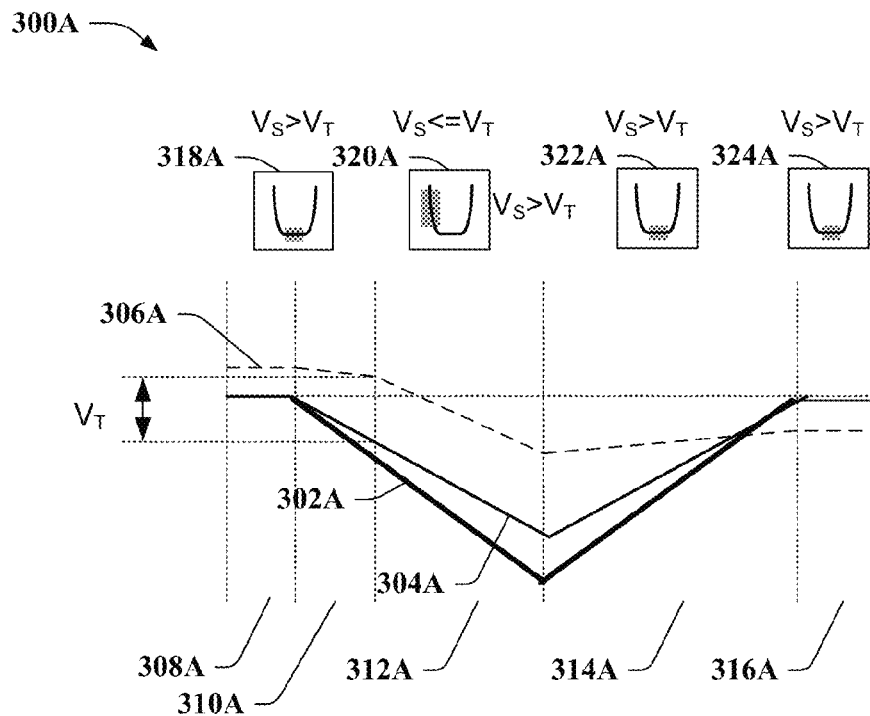

Turning now to FIGS. 3 and 3A, FIG. 3 illustrates a diagram 300 of an example non-volatile memory cell in a program phase in accordance with various aspects described herein. This graph shows the voltages present over time at the first terminal of the capacitor (e.g., 102), represented by bold line 302, a first terminal of the selector device (e.g., 204) represented by solid line 304, and a low-profile MOS transistor gate (e.g., 108) represented by dashed line 306. The vertical distance between solid line 304 and dashed line 306 is $V_S$ and represents the voltage across the selector device. During time period 308, as the applied voltage at the first terminal of the capacitor 402 increases and the voltages at each of the elements increase at respective rates, the relative increases in voltage are based on the respective capacitive ratios of the 3 elements (e.g., capacitor, selector device and MOS transistor gate). The voltage increases fastest at the first terminal 302, approximately equal to the increasing supply voltage, while at a slower rate at the first terminal of the selector device and an even slower rate at the MOS transistor gate, as depicted by signals 304 and 306 respectively during time period 308. Also, during the time period 308, the selector device is in a high resistance state shown by I-V graph 316 (with current on a vertical axis and voltage on a horizontal axis, the shaded region of I-V graph 316 illustrates low conductivity), conducting very little current as depicted by the shaded bottom portion of I-V graph 316. Within region 308 $V_S<V_T$, where $V_T$ is the positive threshold voltage associated with the selector device.

During time period 310 however, the voltage 302 has increased sufficient to cause the voltage 304 across the selector device, $V_S$ to begin to exceed $V_T$. In such a situation, the selector device transitions into a low resistance state, as shown in the shaded portion of I-V graph 318 (where the rapidly increasing current on the right-side vertical line is shaded). In various embodiments, $V_S$ is approximately clamped to $V_T$ for time period 310. In one embodiment, the transition occurs when the difference between the voltage 304 and 306, e.g. the voltage across the selector device, exceeds a positive threshold voltage (e.g. about 1.5 to about 1.7 volts.) In some embodiments, voltage source 302 applies a voltage exceeding about 3.2 volts, for the voltage across the selector device $V_S$ to exceed the positive threshold voltage $V_T$. It should be understood that in other embodiments, the voltage applied by voltage source 302 to achieve the threshold voltage across the selector device will vary depending upon the design parameters and characteristics of the capacitor structure, the selector device, and the MOS transistor.

In various embodiments, within time period 310, the selector device essentially becomes a conductor (as a result of filament formation, discussed above), and the voltage 306 increases at the low-profile MOS gate at a faster rate than it did within time period 308. During this time period 310, the rate of increase of the voltage 304 decreases slightly (not shown in FIG. 3A due to the scale of the change) since the selector is in a conductive state and during that period does not act as a capacitor, thus changing the capacitive ratio(s) of the circuit. The rate of voltage increase at 306 then matches the rate of increase of signal voltage 304. Thus, for time period 310, the rate of voltage increase 304 at the first terminal of the selector device is equal to or approximately equal to the rate of voltage increase 306 at the low-profile gate of the MOS transistor, as $V_S$ remains approximately clamped at $V_T$. In various embodiments, during time period 310, charges are conducted across the selector device and stored on the low-profile gate of the MOS transistor.

During time period 312, the voltage applied by the voltage source has peaked and decreases slowly, and the voltages at the three elements ramp down and as shown in I-V graphs 320 and 322. In other embodiments, the slope or rate of decrease may be different from the slope or rate increase within time periods 308 and 310. In time period 312, the selector device transitions back to the high resistance state (e.g., in time period 312) and maintains the high resistance state (e.g., in time period 314). More particularly, as the applied voltage 320 begins to decrease, the voltage $V_S$ drops below about $V_T$, and thus the selector device enters a high resistance state, and appears as a capacitor in series with the upper capacitor 202 and the lower capacitor 206 (e.g., the low-profile gate of the MOS transistor). The relative decreases in voltage within time period 312 at each of the three elements are then based on respective capacitive coupling ratios of the three devices, following transition of the selector device to the high resistance state, and so when time period 312 ends, there is still some charge accumulated at the low-profile gate of the MOS transistor shown by line 306, even though the capacitor and selector device both reach zero voltage. In time period 314, a small voltage (and thus accumulated charge) of roughly 0.75V remains at the low-profile gate of the MOS transistor.

Turning to FIG. 3A, illustrated is a diagram 300 of an example non-volatile memory cell in an erase phase in accordance with various aspects described herein. This graph shows the voltages applied at each of the first terminal of the capacitor (e.g., 102), represented by bold line 302A, first terminal of the selector device (e.g., 204), represented by solid line 304A, and a low-profile MOS transistor gate (e.g., 108), represented by dashed line 306A. The vertical distance in phase 310 between dashed line 306A and solid line 304A is $V_T$ and represents the negative threshold voltage associated with the selector device while $V_S$ is the voltage across the selector device. Within regions 308A and 310A, $V_S > V_T$. During time period 308A, there is no voltage applied by the voltage source, and the voltages at the first terminal of the capacitor and the selector device are zero, while the gate of the MOS transistor retains the voltage acquired during a previous program phase (e.g., FIG. 3). Since the selector device is in a high resistance state as shown in I-V graph 318A, charge accumulated at the low-profile MOS transistor gate 108 will remain due to the high resistance of the selector device and lack of an external voltage stimulus. In time period 310A however, as a decreasing negative voltage is applied by the voltage source, the voltage drops at the first terminal, selector device and the gate at the rate determined by the respective capacitive ratios.

In phase 312A however, the voltage 302A at the selector device ($V_S$) has crossed the negative voltage threshold $V_T$ and the selector device transitions to a low resistance state as shown in I-V graph 320A. In one embodiment, $V_S$ is approximately clamped to $V_T$. In one embodiment, the transition occurs when the difference between the voltage 304A and 306A, e.g. the voltage across the selector device exceeds the negative threshold voltage (e.g. about −1.5 to about −1.7 volts.) In some embodiments, voltage source 302A applies a voltage exceeding about −3.2 volts, for the voltage across the selector device $V_S$ to exceed the negative threshold voltage $V_T$. It should be understood that in other embodiments, the voltage applied by voltage source 302A to achieve the threshold voltage across the selector device will vary depending upon the design parameters and characteristics of the capacitor structure, the selector device, and the MOS transistor.

In phase 312A, since the capacitive ratio of the circuit changes due to the transition of the selector device (as a result of filament formation, discussed above), the rate of change of the signal 304A decreases slightly since the selector is in a conductive state and does not act as a capacitor any more, thus changing the capacitive ratio(s) of the circuit. (Not shown in FIG. 3A due to the scale of the change). The voltage 306A at the gate begins to drop at the same/similar rate as the voltage at the selector device 304A until time period 314A, when the negative voltage is withdrawn, and the selector device transitions to high resistance state as shown in I-V graph 322A. More particularly, as the applied voltage 302A begins to decrease, the voltage $V_S$ drops below about $V_T$, and thus the selector device enters a high resistance state, and appears as a capacitor in series with the capacitor and the MOS transistor. The supply voltage 302A and voltage at the first terminal of the selector device 304A continue to decrease to zero. Eventually, by time period 316A, a negative voltage remains at the low-profile gate of the MOS transistor, whereas voltages 302A and 304A have returned to zero. Since the selector device is in low resistance state (e.g., I-V graph 324A) and there is no external voltage stimulus applied, the negative charge and a voltage of roughly −0.75V remain at the low-profile gate of the MOS transistor.

Figure 4:
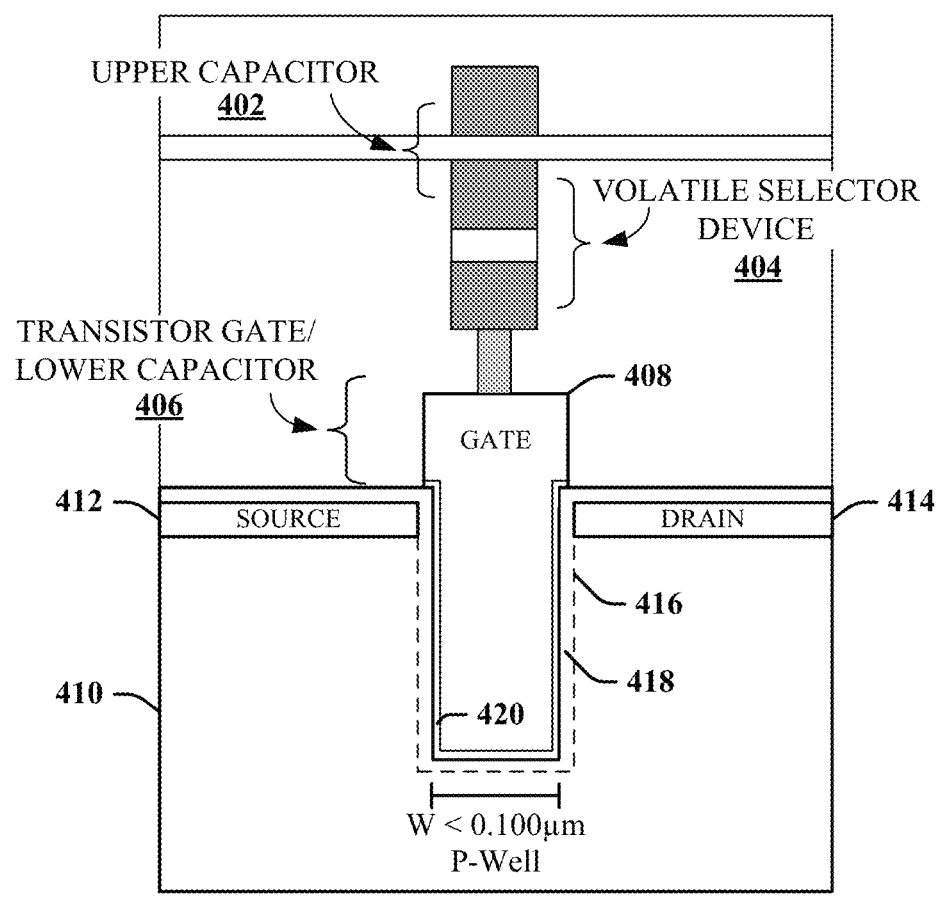
FIG. 4 illustrates a diagram of an example non-volatile memory cell in further embodiments.

Turning now to FIG. 4, there is depicted a cross section view of an example non-volatile memory device 400 suitable for high density integration in a memory array, according to embodiments of the present disclosure. Non-volatile memory device 400 can comprise an upper capacitor 402 (e.g., a metal-insulator-metal construct, or the like) in electrical series with a volatile selector device 404, which is also in electrical series with a gate 408 of a transistor 406 (e.g., a lower capacitor). In various embodiments, the gate 408 can be a low-profile gate having a width substantially equal to a width of a p-well formed beneath the low-profile gate 408. In some embodiments, the width of the p-well (and approximate width of gate 408) can be about 100 nanometers (nm) or less. In at least some embodiments, the width of the p-well (and approximate width of gate 408) can be about 55 nm or less. In at least some embodiments, the width of the p-well can scale down to as low as about 20 nm, while maintaining adequate leakage current mitigation. Compared to conventional transistors having gate widths on an order of 300 nm or more (e.g., 320 nm, 330 nm, etc.), low-profile gate 408 and non-volatile memory device 400 can consume significantly less substrate surface area, facilitating high density integration in an array of non-volatile memory devices 400.

As illustrated, transistor 406 has a p-well 418 formed within a substrate 410. Substrate 410 can be a suitable semiconductor material, doped or undoped, or other suitable material. P-well 418 can be lined with an insulating film 420 in some embodiments. Insulating film 420 can help reduce leakage current directly between a source 412 and drain 414 of transistor 406, forcing current to follow the a path 416 illustrated by the dashed line, around most of a perimeter of p-well 418. This longer path 416 (compared with a direct distance between source 412 and drain 414) can facilitate reduction in width of p-well 418 and gate 408, reducing an area consumed by gate 408 above substrate 410.

Figure 5:
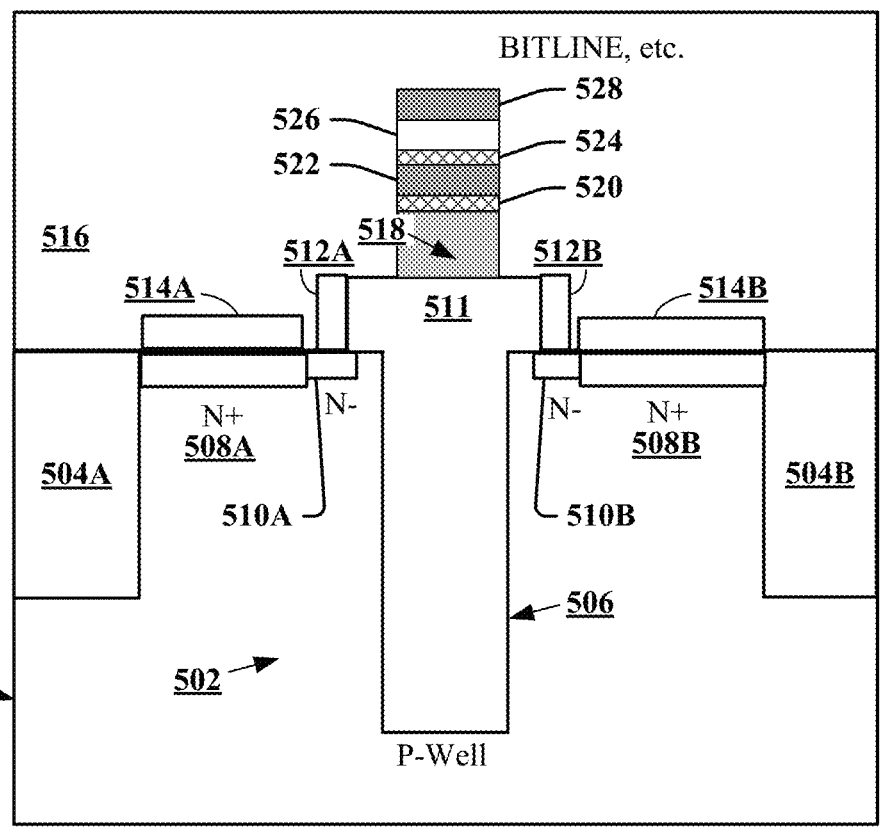
FIG. 5 illustrates a diagram of a sample non-volatile memory cell in another embodiment(s)

Overlying gate 408 is volatile selector device 404, which can comprise a bottom electrode, selector layer and top electrode (e.g., see FIG. 5, infra). The top electrode of volatile selector device 404 can serve as a lower terminal for upper capacitor 402, in some embodiments. In other embodiments, an additional conductive material can be provided above the top electrode of volatile selector device 404, to serve as a separate lower terminal for upper capacitor 402. In an embodiment, upper capacitor 402 can be a metal-insulator-metal (MIM) capacitor, with an insulating layer (white layer extending across a width of non-volatile memory device 400) between two conductive terminals (shaded blocks above and below the insulating layer). In various embodiments, the insulating layer can be limited in extent (e.g., width, depth, etc.) to approximately the extent of the two conductive terminals of upper capacitor 402, and therefore the insulating layer does not extend across the width of non-volatile memory device 400 in such embodiments.

FIG. 5 illustrates a cross section diagram of an example non-volatile memory device 500 according to still further embodiments of the present disclosure. Non-volatile memory device 500 comprises a deep trench transistor device 502 having a p-well 506 formed deeply within a substrate 501 of non-volatile memory device 500. In some embodiments, p-well 506 can be up to (about) 0.2 μm in depth (e.g., below a surface of substrate 501). In other embodiments, p-well 506 can be greater than about 0.1 μm in depth. Isolation oxides 504A, 504B are provided at a perimeter of deep trench transistor device 502. An N+ source 508A and N+ drain 508B are provided, with lightly doped N− contacts 510A, 510B, as depicted. Drain and source regions 508A, 508B and lightly doped n− contacts can be formed by ion implantation with arsenic or phosphorous (for NMOS type transistors) or boron (for PMOS type transistors). In some embodiments, insulating (e.g., dielectric) spacers 512A, 512B can be provided flanking a gate 511 of deep trench transistor device 502.

Overlying and in electrical contact with gate 511 is a metal interconnect 518. Overlying metal interconnect 518 is selector layer stack comprising a bottom electrode metal 520, a volatile resistive-switching selector layer 522, and a top electrode metal 524. The selector layer stack can operate as a volatile resistive switching selector device, as described herein. Overlying top electrode metal 524 is an insulator material 526 (e.g., an oxide), and a metal material 528 (e.g., a metal line of a memory device, such as a bitline, wordline, dataline, sourceline, etc.) Metal material 528, insulator material 526 and top electrode metal 524 can form a M-I-M capacitor (e.g., for upper capacitor 402 of FIG. 4, supra). In an embodiment, an additional metal material (not depicted) can be provided between top electrode metal 524 and insulator material 526 to serve as a separate bottom contact for the M-I-M capacitor (e.g., replacing top electrode metal 524). Top electrode metal 524 can serve as a metal interconnect between the M-I-M capacitor and the volatile resistive switching selector layer 522, in various embodiments, and metal interconnect 518 serves as a metal interconnect between the volatile resistive switching selector layer 522 and gate 511. The metal interconnect 518, gate 511 (e.g., a polysilicon material, or the like) and source or drain of deep trench transistor device 502 can serve as an additional capacitor (e.g., transistor/lower capacitor 406 of FIG. 4, supra).

FIGS. 6 through 17 illustrate an example process(es) for forming a disclosed non-volatile memory device, in additional embodiments. In some embodiments, the non-volatile memory device formed by the example process(es) can be non-volatile memory device 500 of FIG. 5, supra. However, the subject disclosure is not so limited, and such process(es) can be utilized to form variations thereof consistent with the subject disclosure or made known to one of skill in the art by way of the context provided herein.

Figure 6:
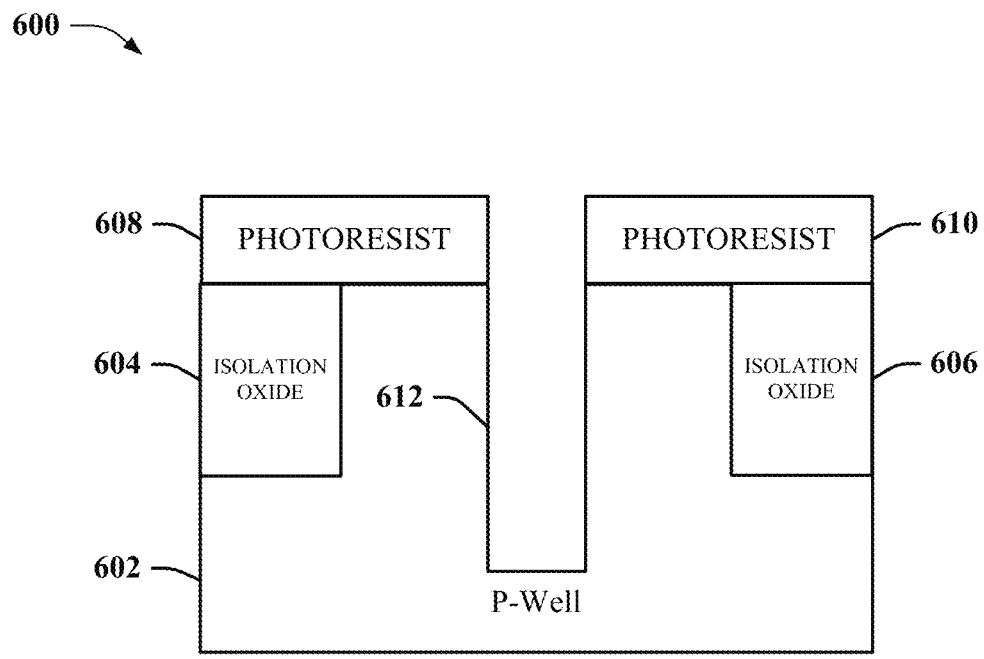
FIG. 6 illustrates a diagram of an example deep transistor well for a non-volatile memory cell according to various embodiments.

FIG. 6 illustrates a device 600 comprising a substrate 602 and a p-well 612 formed in substrate 602. In some embodiments, p-well 61 can be a deep trench well, having an aspect ratio of depth to width greater than 1:1. Stated differently, p-well can have a depth and a width, wherein the depth is larger than the width. In some embodiments the aspect ratio can be about 2 to about 1; in other embodiments the aspect ratio can be about 4 to about 1; whereas in still other embodiments, other suitable aspect ratios can be provided. Additionally, device 600 can comprise isolation oxides 604 and 606 that flank p-well 612. In embodiments where p-well 612 is formed by patterning and etching, a photoresist 608, 610 can remain overlying substrate 602, except where p-well 612 is etched from the photoresist 608, 610. In other embodiments, for instance where p-well 612 is formed with a damascene process (e.g., substrate material is mechanically removed from p-well 612), the photoresist 608, 610 can be absent.

Figure 7:
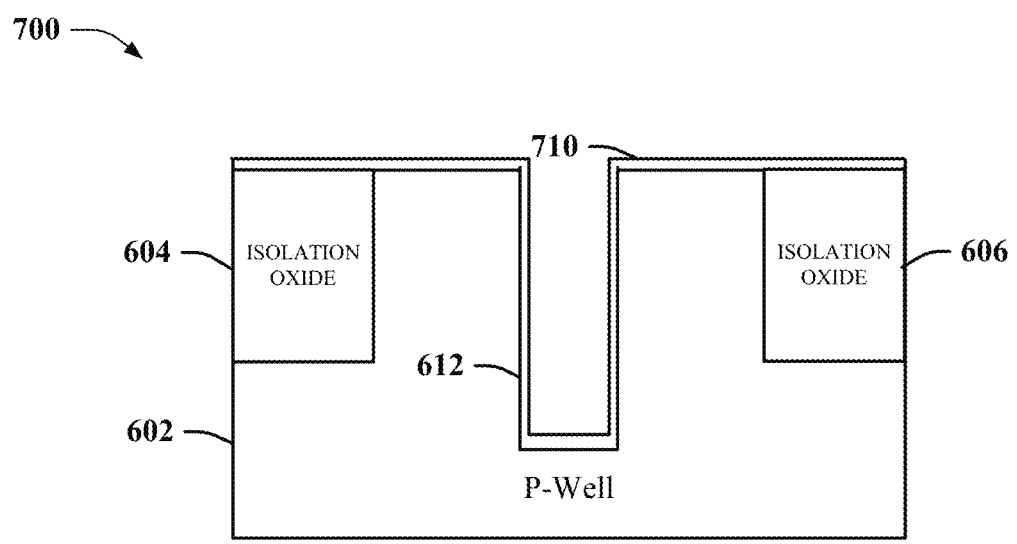
FIG. 7 illustrates a diagram of an example well liner for the deep transistor well in a further embodiment.

FIG. 7 illustrates a device 700 comprising an insulating film 710 formed over p-well 612. In some embodiments, insulating film 710 can overly isolation oxides 604 and 606 and a top surface of substrate 602. Insulating film 710 can be a suitable electrical insulating material (e.g., an oxide, etc.). In some embodiments, insulating film 710 is optional and a non-volatile memory device can be formed without insulating film 710.

Figure 8:
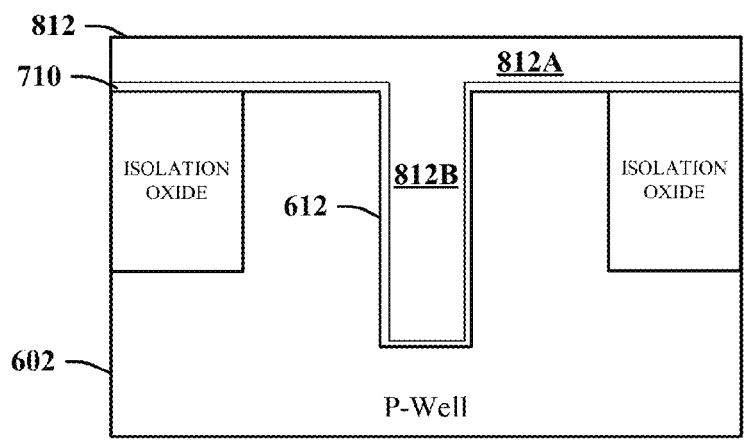
FIG. 8 illustrates a diagram of a sample gate fabrication for the non-volatile memory cell.

FIG. 8 illustrates a device 800 comprising a gate material 812 overlying insulating film 710 (where utilized) and p-well 612. Gate material 812 can be a polysilicon material, in some embodiments, a polycrystalline silicon material, in other embodiments, or a similar material. Gate material 812 can be doped or undoped in additional embodiments. As illustrated, gate material 812 is deposited in a first section 812A overlying substrate 602 as well as a second section 812B filling a void within p-well 612.

Figure 9:
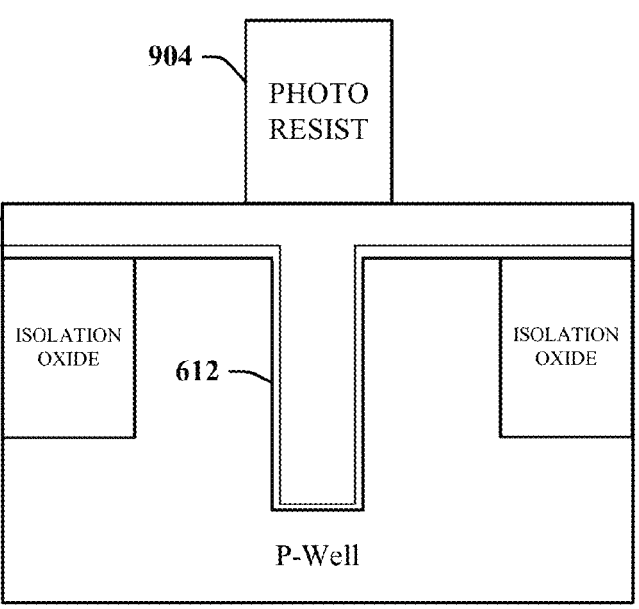
FIG. 9 illustrates a diagram of an example pattern and etch step for a transistor of the non-volatile memory cell, in one or more embodiments.
Figure 10:
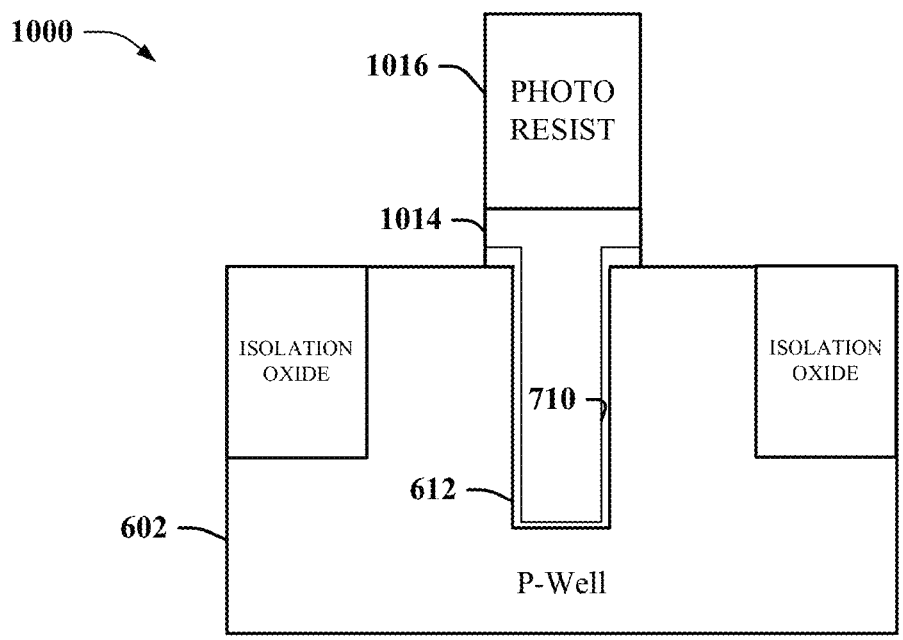
FIG. 10 depicts a diagram of an example gate etch for a transistor of the non-volatile memory cell.

FIG. 9 depicts a device 900 prepared for etching of a low-profile gate to overly a p-well of a transistor, according to further embodiments. Device 900 can comprise a photo resist 904 formed overlying gate material 812 and p-well 612. In an embodiment, photo resist 904 can have a width substantially equivalent to that of p-well 612. In another embodiment, photo-resist 904 can have a width slightly larger or slightly smaller than the width of p-well 612. Referring to FIG. 10, a device 1000 is depicted for which etching of gate material 812 and insulating film 710 is complete, resulting in a low-profile gate 1014 overlying p-well 612. Insulating film 710 lines interior surfaces of p-well 612, between substrate 602 and gate material 812 beneath low-profile gate 1014. A remnant of photoresist 1016 can remain above low-profile gate 1014 after the etching, which can be removed (e.g., by chemical mechanical polishing, or other suitable mechanism).

Figure 11:
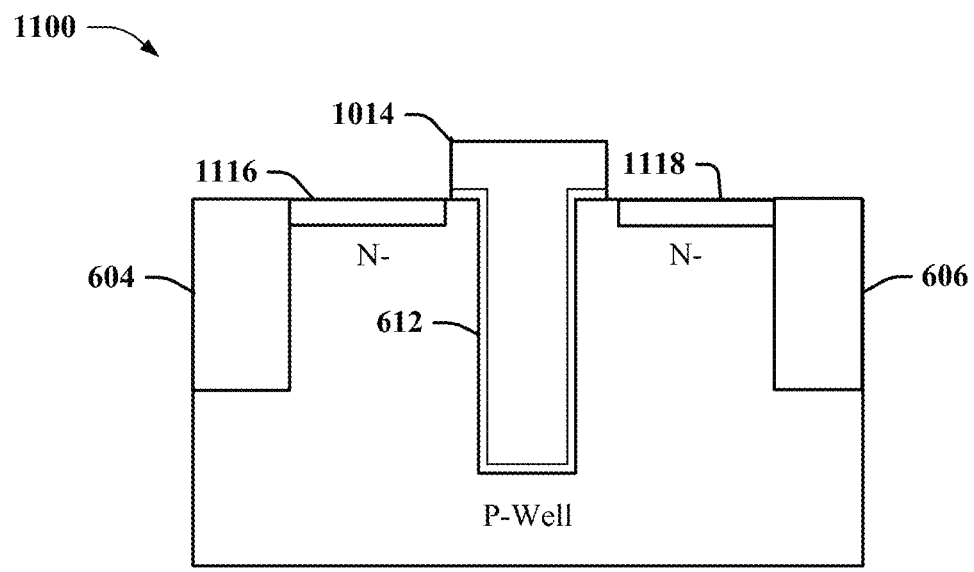
FIG. 11 depicts a diagram of an example source and drain preparation for the transistor of the non-volatile memory cell.

FIG. 11 illustrates a device 1100 according to further embodiments of the present disclosure. Device 1100 has photoresist 1016 removed, leaving low-profile gate 1014. Doping of sections of substrate 602 can form N− regions 1116, 1118 between p-well 612 and isolation oxides 604, 606. In some embodiments, N− regions 1116, 1118 can be lightly doped forming a lightly doped source and drain of a deep trench transistor. The lightly doped drain and source regions can be formed by ion implantation with arsenic or phosphorous (e.g., for NMOS type transistors) or boron (e.g., for PMOS type transistors), where the depth is up to (about) 0.2 μm, as one example.

Figure 12:
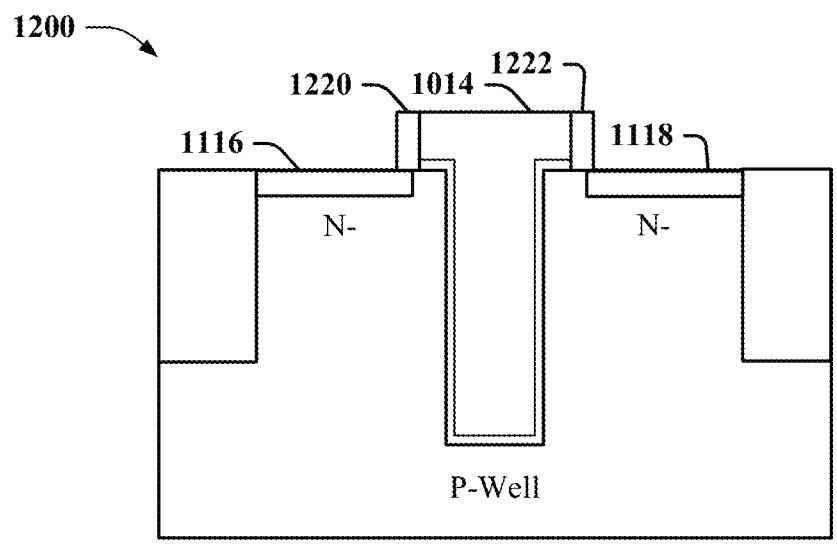
FIGS. 12 and 13 illustrate diagrams of example barrier or spacer materials for the non-volatile memory cell.

FIG. 12 illustrates a device 1200 according to additional embodiments of the present disclosure. In FIG. 12, dielectric spacers 1220, 1222 can be formed on either sides of low-profile gate 1014, and over subsets of lightly doped regions 1116, 1118. In an embodiment, dielectric spacers 1220, 1222 can be formed in an oxidation step.

Figure 13:
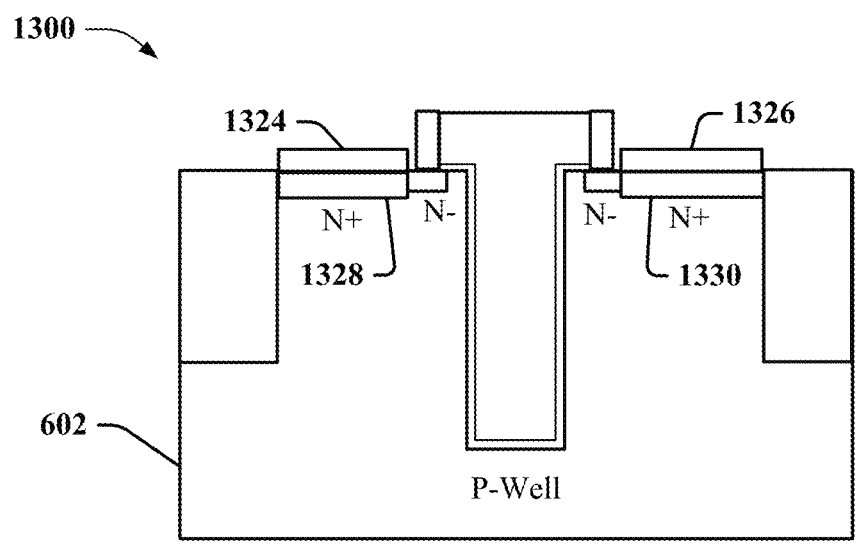

FIG. 13 depicts a device 1300 according to still further embodiments of the present disclosure. Device 1300 can include a recessed (e.g., high voltage) metal oxide semiconductor transistor, in various embodiments. Doped N+ drain and source regions 1328, 1330, respectively, can be formed in substrate 602 adjacent to lightly doped N− regions. Doped N+ drain and source regions 1328, 1330 can be formed by ion implantation with arsenic or phosphorous (for NMOS type transistors) or boron (for PMOS type transistors), where the depth is up to (about) 0.2 μm. Additionally, salicide regions 1324 and 1326 can be formed above the doped N+ drain and source regions 1328, 1330. The salicide can be formed from Nickel, Cobalt, or Titanium, or a combination thereof, in some embodiments. These salicide regions 1324, 1326 can form ohmic contacts for N+ drain and source regions 1328, 1330, respectively, which can be connected to an input signal (e.g., the signal in input to lower capacitor 206 of FIG. 2, supra) or an output line to a select switch (e.g., select switch 208 of FIG. 2, supra) and sense amp(s) (e.g., sense amp(s) 210).

Figure 14:
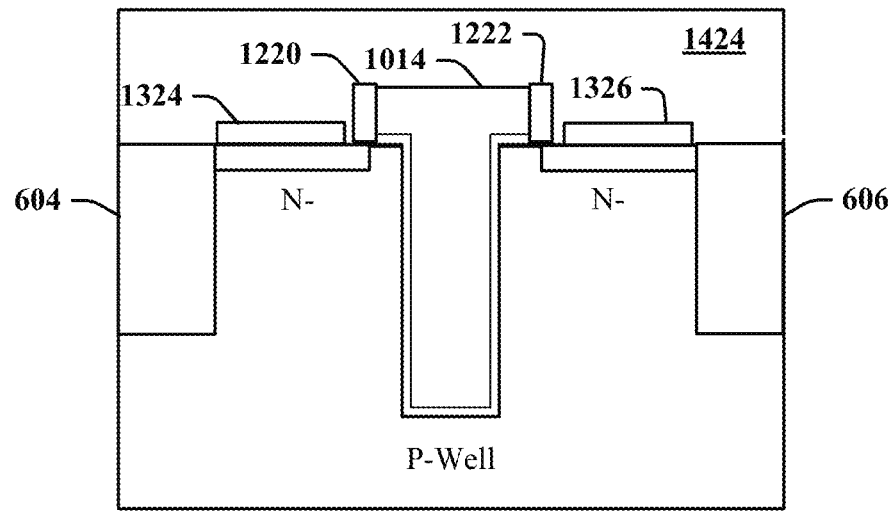
FIGS. 14 and 15 depict diagrams of an example sequence of layers for a volatile element and metal interconnects for the non-volatile cell.
Figure 15:
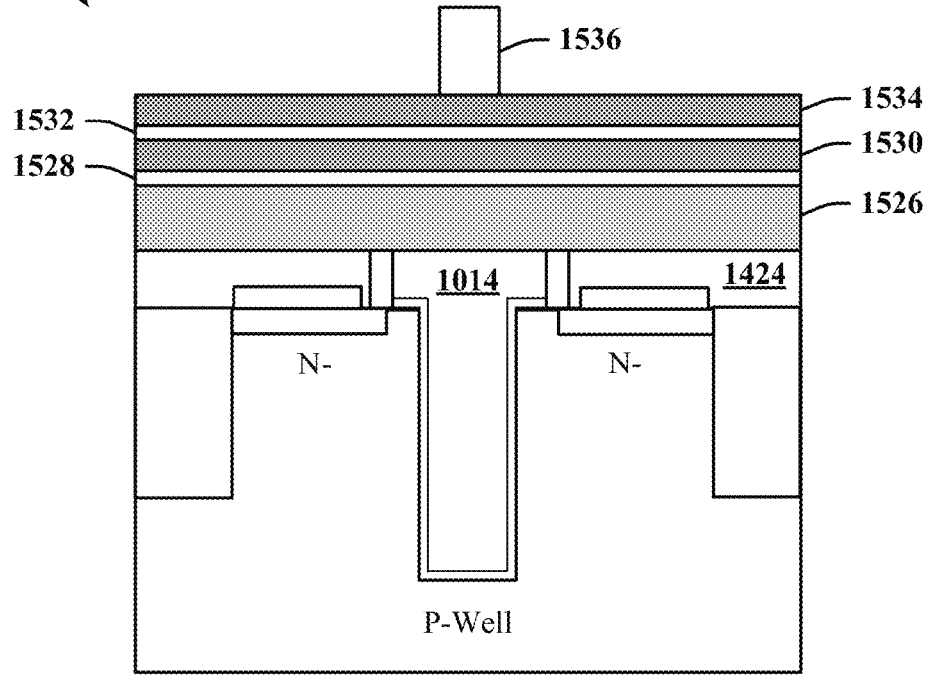

FIG. 14 illustrates a device 1400 comprising a deep trench transistor according to further embodiments of the present disclosure. Device 1400 can comprise an insulating layer 1424 formed overlying low-profile gate 1014, and dielectric spacers 1220, 1222, as depicted. Insulating layer 1424 can further overly salicide contacts 1324, 1326 and isolation oxides 604, 606, as depicted. FIG. 15 depicts a device 1500 in which insulating layer 1424 is planarized (e.g., by CMP or other suitable planarization process) to form a planar surface exposing a top surface of low-profile gate 1014. A stack of layers can be deposited over insulating layer 1424 and low-profile gate 1014, including a first metal electrode layer 1526, a selector layer 1528, a second metal electrode layer 1530, an insulating layer 1532, and a conductive layer 1534. Additionally, a photoresist or mask 1536 can be formed and patterned over the stack of layers to serve as an etching pattern for the stack of layers.

Figure 16:
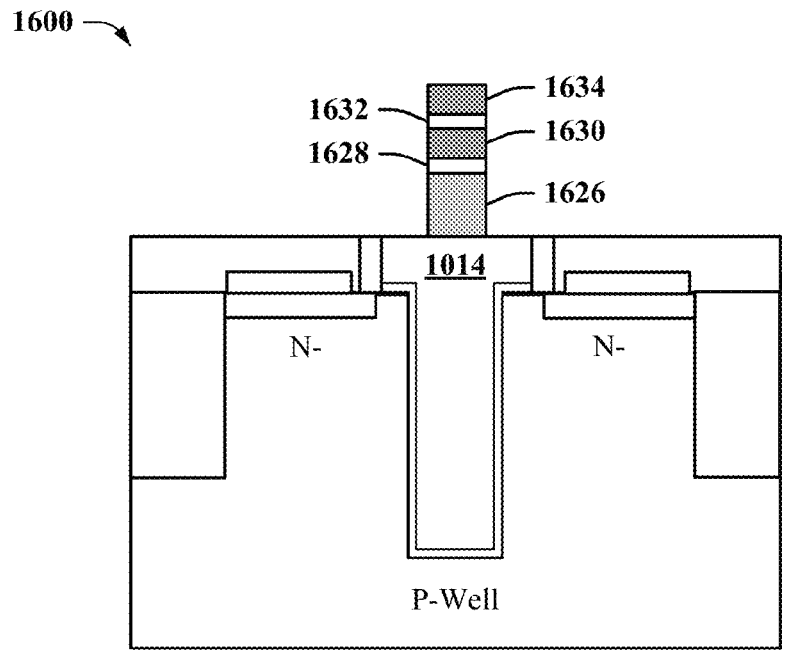
FIGS. 16 and 17 illustrate diagrams of an example etched stack of the sequence of layers and surrounding electrical insulation for the non-volatile memory cell.

Turning to FIG. 16, a device 1600 is depicted comprising a deep trench transistor having a selector device and upper capacitor formed over the deep trench transistor. The selector device can comprise a bottom electrode 1626, a selector layer 1628, a top electrode 1630, an insulating medium 1632, and a conductive contact 1634. In various embodiments, bottom electrode 1626, selector layer 1628 and top electrode 1630 can form a selector device (e.g., volatile resistive switching device) connected electrically in serial with low-profile gate 1014. Further, top electrode 1630, insulating medium 1632 and conductive contact 1634 can form a M-I-M capacitor connected electrically in serial with the selector device (e.g., as illustrated in FIG. 4 or 5, supra). In an embodiment, an additional metal material can be provided between top electrode 1630 and insulating medium 1632, where the additional metal material serves as a bottom contact for the M-I-M capacitor in place of top electrode 1630.

Figure 17:
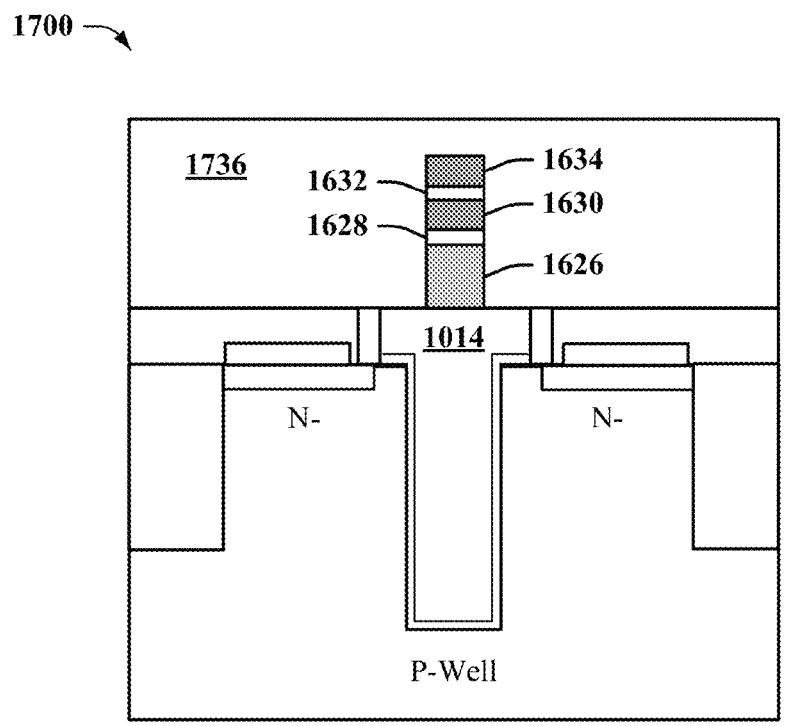

FIG. 17 illustrates a completed non-volatile memory device 1700 according to one or more disclosed embodiments. An insulating layer 1736 is formed overlying a deep trench transistor and a stack of materials overlying a low-profile gate 1014 of the deep trench transistor. The stack of materials can comprise the selector device and M-I-M capacitor described above. In one or more embodiments, conductive contact 1634 can be connected to a metal line (not depicted, but see signal input into lower capacitor 206 of FIG. 2, supra) of a memory array, such as a signal line (e.g., a bitline, a wordline, etc.) to provide a voltage, current, electric field, or other suitable signal to the stack of materials. A second metal line (not depicted) can be connected to a source of the deep trench transistor, and a drain of the deep trench transistor can be connected to a read output line (not depicted, but see drain 112 of transistor/lower capacitor 106 of FIG. 1, supra).

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a read process or a write process can comprise an inhibit process, or the like, or vice versa, to facilitate selective reading or writing to subsets of memory cells on a common line. Components of the disclosed architectures can also interact with one or more other components not specifically described herein but known by those of skill in the art.

Figure 18:
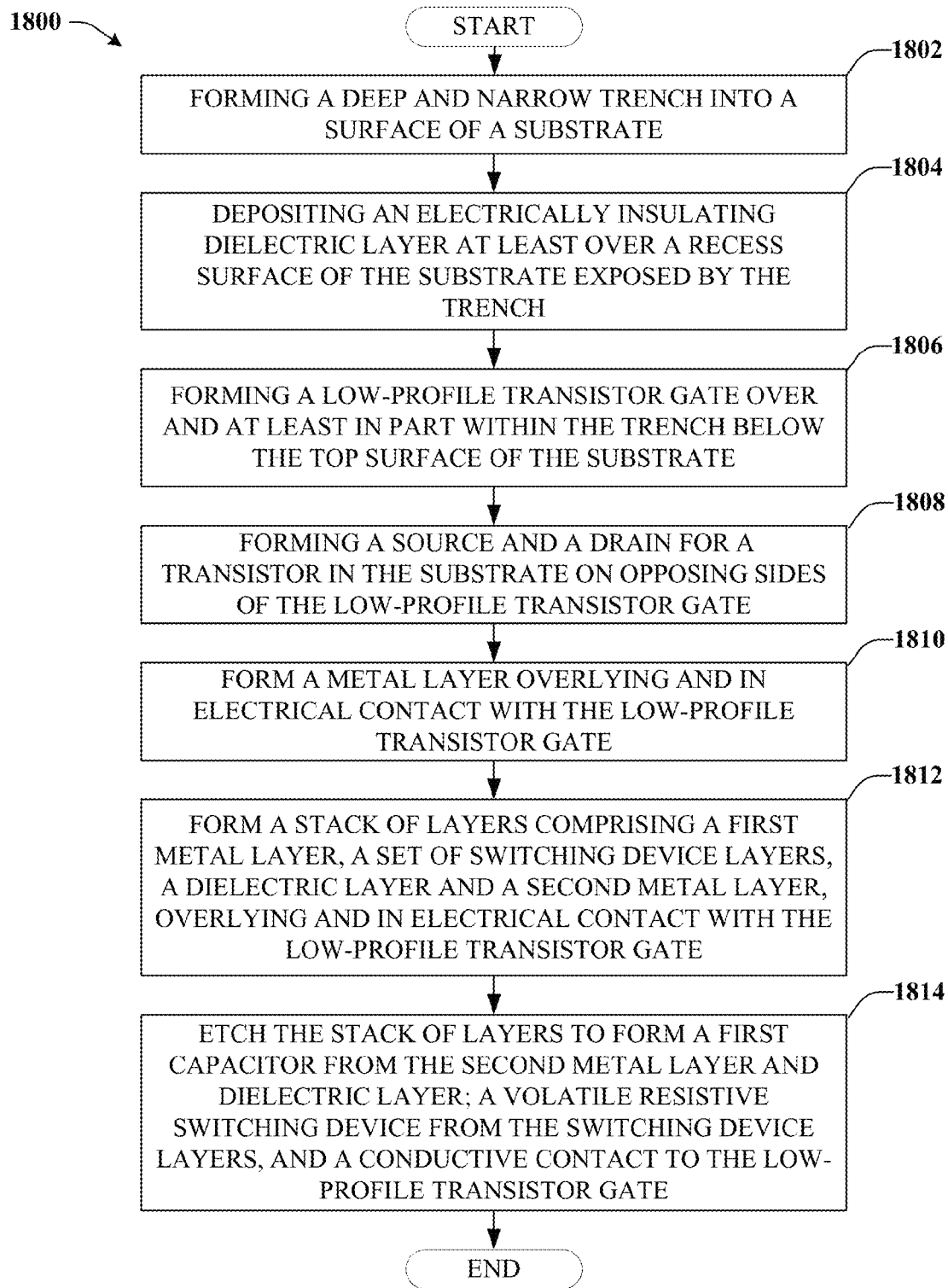
FIG. 18 depicts a flowchart of a sample method for fabricating a high density selector-based non-volatile memory cell, in one or more embodiments.
Figure 19:
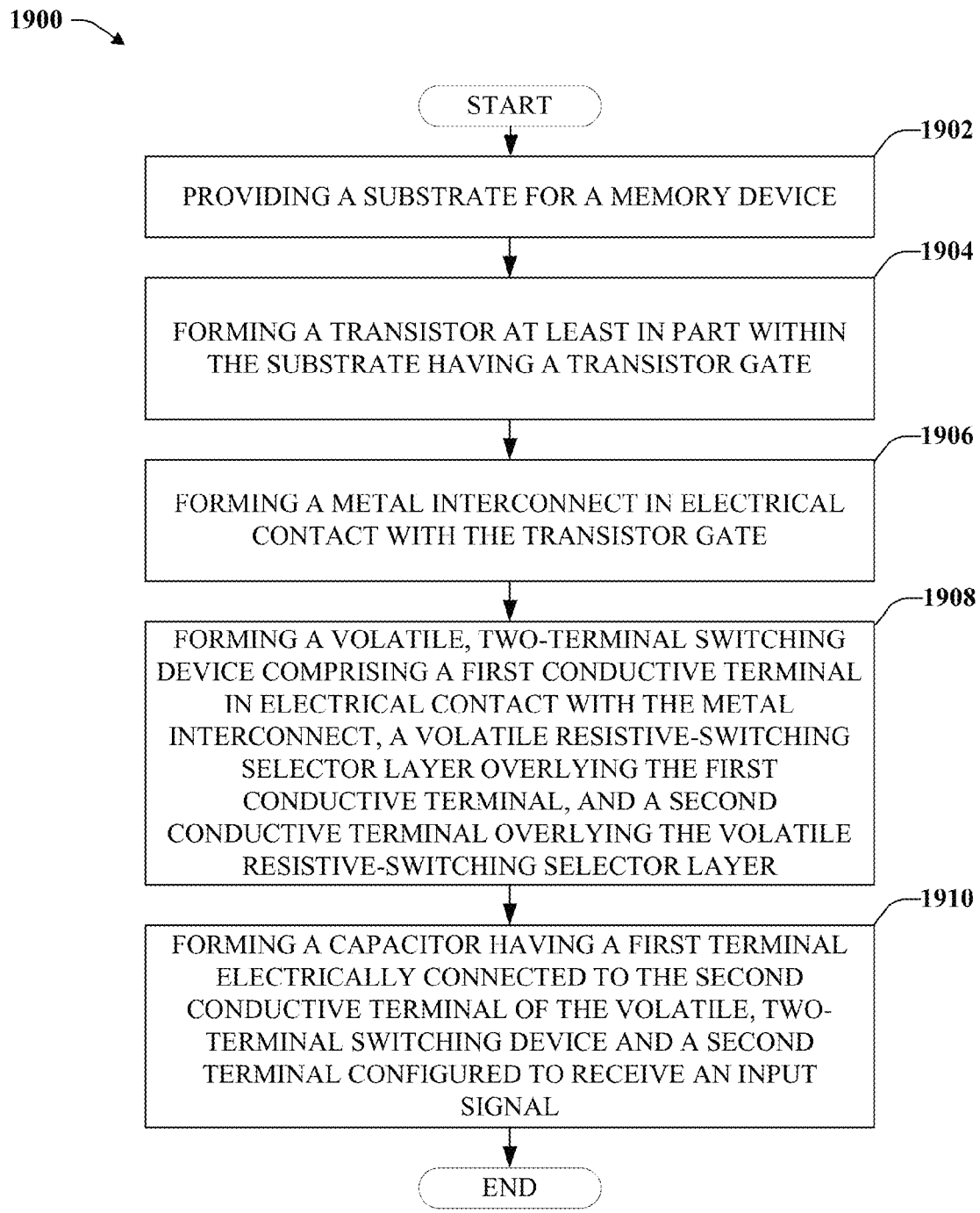
FIG. 19 illustrates a flowchart of an example method for fabricating a high density selector-based non-volatile memory according to further embodiments.

In view of the exemplary diagrams described supra, process methods that can be implemented in accordance with the disclosed subject matter will be better appreciated with reference to the flow charts of FIGS. 18 and 19. While for purposes of simplicity of explanation, the methods of FIGS. 18 and 19 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

Turning now to FIG. 18, there is depicted a method 1800 for fabricating a memory device according to additional embodiments of the present disclosure. At 1802, method 1800 can comprise forming a deep and narrow trench into a surface of a substrate. At 1804, method 1800 can comprise depositing an electrically insulating dielectric layer at least over a recess surface of the substrate exposed by the trench. Further, at 1806, method 1800 can comprise forming a low-profile transistor gate over and at least in part within the trench below the top surface of the substrate. At 1808, method 1800 can comprise forming a source and a drain for a transistor in the substrate on opposing sides of the low-profile transistor gate.

At 1810, method 1800 can comprise forming a metal layer overlying and in electrical contact with the low-profile transistor gate. At 1812, method 1800 can comprise forming a stack of layers comprising a first metal layer, a set of switching device layers, a dielectric layer and a second metal layer, overlying and in electrical contact with the low-profile transistor gate. At 1814, method 1800 can comprise etching the stack of layers to form a first capacitor form the second metal layer and dielectric layer, a volatile resistive switching device from the switching device layers, and a conductive contact between a bottom electrode of the volatile resistive switching device and the low-profile transistor gate. In a further embodiment, method 1800 can additionally comprise forming an insulating layer overlying the etched stack of layers, and the substrate.

FIG. 19 depicts a flowchart of a sample method 1900 for fabricating a selector-based non-volatile memory device according to additional embodiments of the present disclosure. At 1902, method 1900 can comprise providing a substrate for a memory device, and at 1904, method 1900 can comprise forming a transistor at least in part within the substrate having a transistor gate. In various embodiments, the transistor can be a deep trench transistor having a p-well with a depth and width, wherein the depth is greater than the width. In an embodiment, the depth can be greater than about 100 nm (e.g., 100 nm, 200 nm, etc.) and the width can be smaller than about 100 nm (e.g., <100 nm, about 55 nm, 20 nm, etc.). In further embodiments, the gate can be a low-profile gate having a width or depth approximately equal to the width of the p-well.

At 1906, method 1900 can comprise forming a metal interconnect in electrical contact with the transistor gate. At 1908, method 1900 can comprise forming a volatile, two-terminal switching device comprising a first conductive terminal in electrical contact with the metal interconnect, a volatile resistive-switching selector layer overlying the first conductive terminal, and a second conductive terminal overlying the volatile resistive-switching selector layer. At 1910, method 1900 can comprise forming a capacitor having a first terminal electrically connected to the second conductive terminal of the volatile, two-terminal switching device and a second terminal configured to receive an input signal.

In an embodiment, method 1900 can comprise forming the transistor by forming a trench within the substrate having a depth and a width, wherein the depth of the trench is greater than the width of the trench. Additionally, the transistor can be formed by forming the transistor gate at least in part within the trench within the substrate and at least in part overlying the trench within the substrate, the transistor gate having a width substantially the same as the width of the trench.

In one or more additional embodiments, method 1900 can further comprise forming an insulating film overlying a surface of the substrate exposed by the trench within the substrate, wherein the transistor gate is adjacent to the insulating film. In some embodiments, method 1900 can comprise forming the trench within the substrate with the depth greater than about 100 nm and with the width less than about 100 nm, and in other embodiments method 1900 can comprise forming the trench within the substrate with the depth no less than 200 nm, and with the width of about 55 nm or less.

According to other embodiments, method 1900 can comprise forming an insulator layer overlying the second conductive terminal of the volatile, two-terminal switching device and forming the second terminal overlying the insulator layer. Moreover, method 1900 can comprise electrically connecting the second terminal to an input node associated with the input signal in some embodiments.

In some embodiments, method 1900 can comprise forming the first conductive terminal of the volatile, two-terminal switching device from a member selected from a group consisting of: TiN, TaN, Cu, Al, Ag and an alloy of the foregoing. In additional embodiments, method 1900 can comprise forming the second conductive terminal of the volatile, two-terminal switching device from a member selected from a group consisting of: TiN, TaN, Cu, Al, Ag and an alloy of the foregoing. Method 1900 can additionally comprise forming the volatile, resistive-switching selector layer to have few particle trapping voids or defects, and utilizing a material selected from a group consisting of: undoped amorphous Si, a semiconductor having intrinsic characteristics, a Si sub-oxide, a non stoichiometric Si bearing material and a non-stoichiometric metal oxide. In one or more other embodiments, method 1900 can comprise forming a second transistor at least in part within the substrate and having a second channel region connected in series with a first channel region of the transistor, forming a gate for the second transistor, and connecting the gate to a second signal input.

Example Operating Environments

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 20 and 21, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. These or similar considerations can be addressed by some or all of the disclosed aspects.

Figure 20:
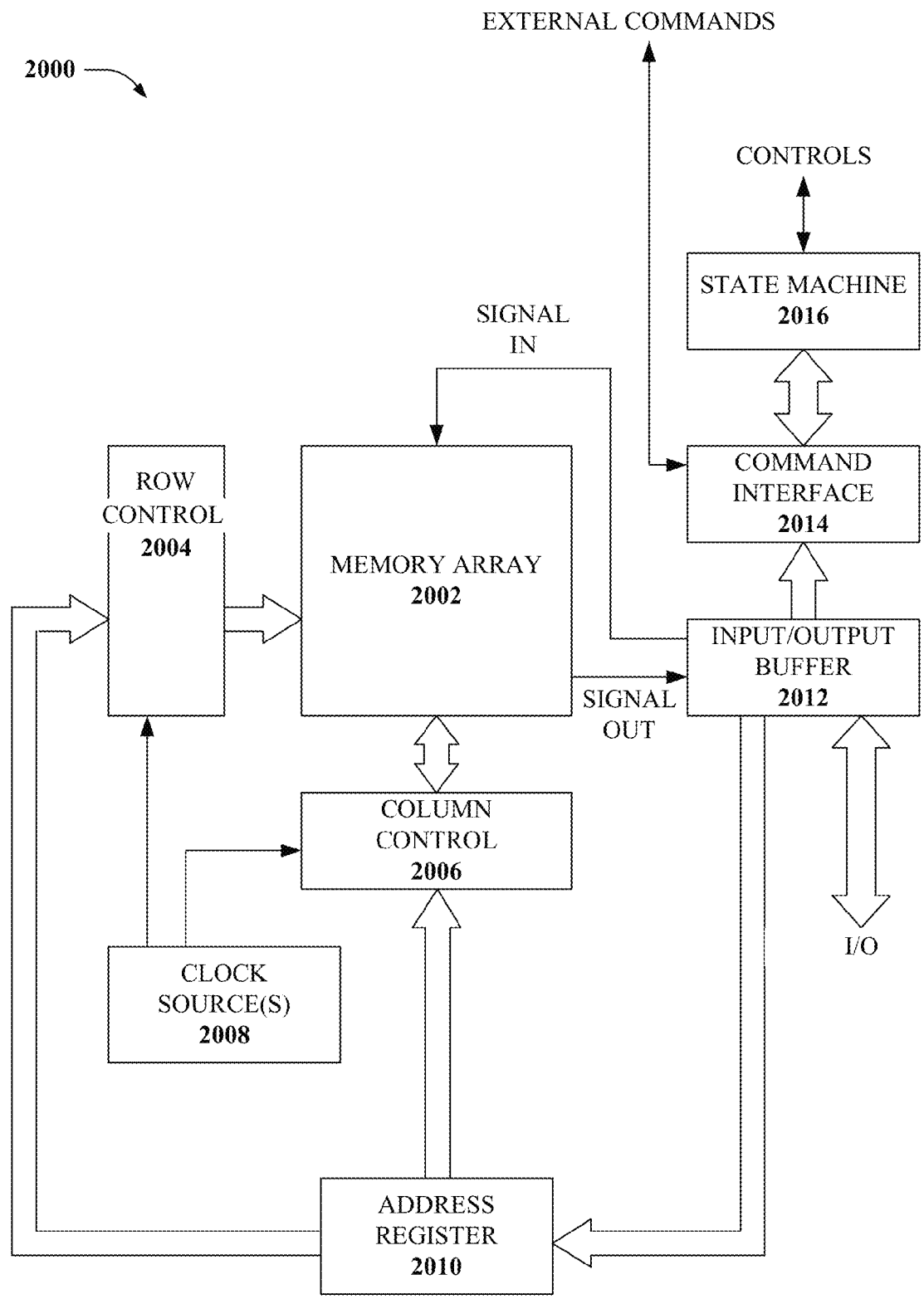
FIG. 20 depicts a block diagram of a sample operating environment for facilitating implementation of one or more aspects disclosed herein.

In order to provide a context for the various aspects of the disclosed subject matter, FIG. 20, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 20 illustrates a block diagram of an example operating and control environment 2000 for a memory cell array 2002 according to aspects of the subject disclosure. In at least one aspect of the subject disclosure, memory cell array 2002 can comprise a variety of memory cell technology. Particularly, memory cell array 2002 can comprise two-terminal memory such as high density, selector-based resistive memory cells with a low-profile gate (e.g., a gate consuming a relatively small substrate surface area compared with conventional transistor gate devices), as described herein.

A column controller 2006 can be formed adjacent to memory cell array 2002. Moreover, column controller 2006 can be electrically coupled with bit lines of memory cell array 2002. Column controller 2006 can control respective bitlines, applying suitable program, erase or read voltages to selected bitlines.

In addition, operating and control environment 2000 can comprise a row controller 2004. Row controller 2004 can be formed adjacent to column controller 2006, and electrically connected with word lines of memory cell array 2002. Row controller 2004 can select particular rows of memory cells with a suitable selection voltage. Moreover, row controller 2004 can facilitate program, erase or read operations by applying suitable voltages at selected word lines.

A clock source(s) 2008 can provide respective clock pulses to facilitate timing for read, write, and program operations of row control 2004 and column control 2006. Clock source(s) 2008 can further facilitate selection of word lines or bit lines in response to external or internal commands received by operating and control environment 2000. An input/output buffer 2012 can be connected to an external host apparatus, such as a computer or other processing device (not depicted) by way of an I/O buffer or other I/O communication interface. Input/output buffer 2012 can be configured to receive write data, receive an erase instruction, output readout data, and receive address data and command data, as well as address data for respective instructions. Address data can be transferred to row controller 2004 and column controller 2006 by an address register 2010. In addition, input data is transmitted to memory cell array 2002 via signal input lines, and output data is received from memory cell array 2002 via signal output lines. Input data can be received from the host apparatus, and output data can be delivered to the host apparatus via the I/O buffer.

Commands received from the host apparatus can be provided to a command interface 2014. Command interface 2014 can be configured to receive external control signals from the host apparatus, and determine whether data input to the input/output buffer 2012 is write data, a command, or an address. Input commands can be transferred to a state machine 2016.

State machine 2016 can be configured to manage programming and reprogramming of memory cell array 2002. State machine 2016 receives commands from the host apparatus via input/output interface 2012 and command interface 2014, and manages read, write, erase, data input, data output, and like functionality associated with memory cell array 2002. In some aspects, state machine 2016 can send and receive acknowledgments and negative acknowledgments regarding successful receipt or execution of various commands.

In an embodiment, state machine 2016 can control an analog voltage waveform generator 2018 that provides read/write and program/erase signals to row control 2004 and column control 2006.

To implement read, write, erase, input, output, etc., functionality, state machine 2016 can control clock source(s) 2008. Control of clock source(s) 2008 can cause output pulses configured to facilitate row controller 2004 and column controller 2006 implementing the particular functionality. Output pulses can be transferred to selected bit lines by column controller 2006, for instance, or word lines by row controller 2004, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 21, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 21:
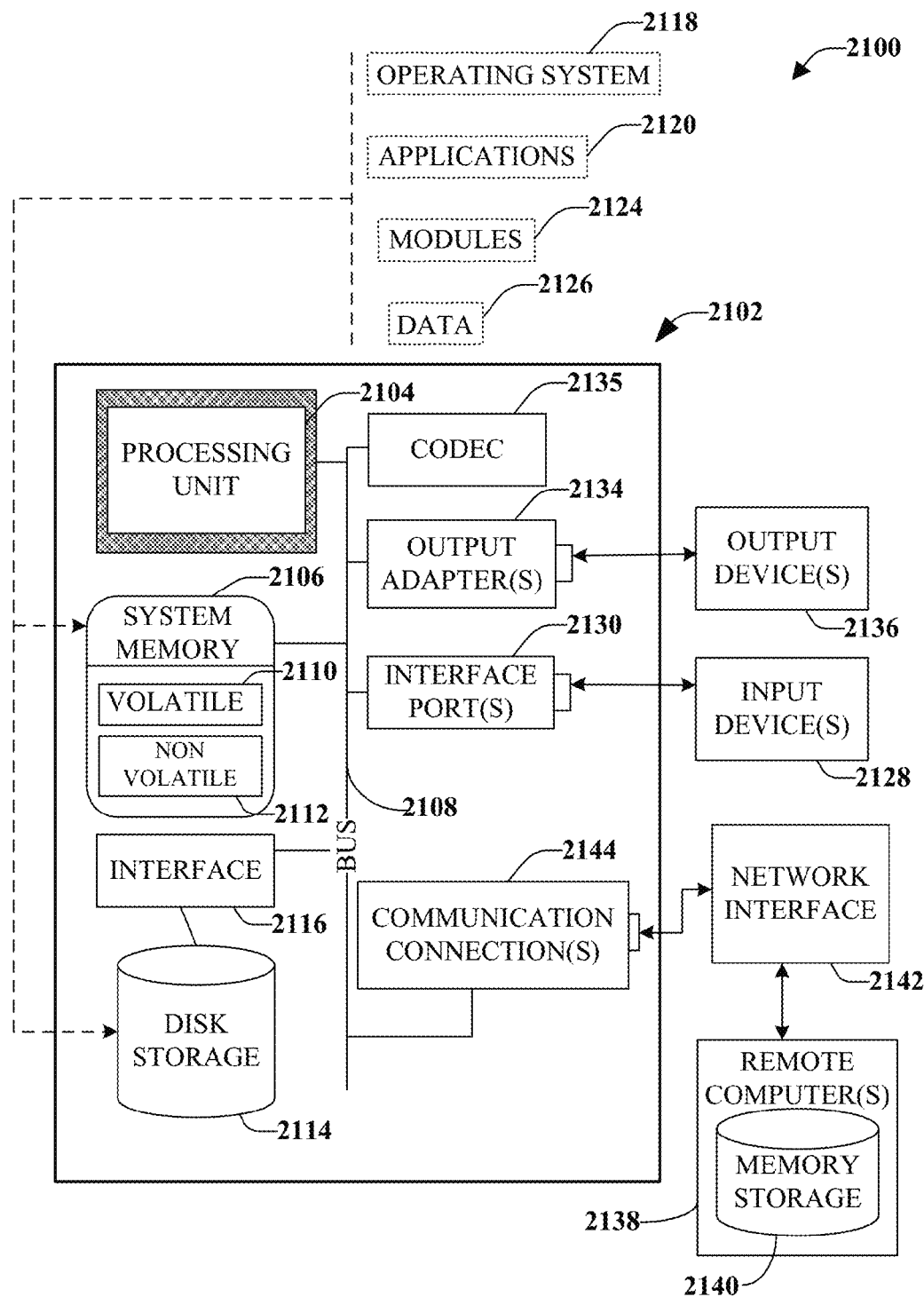
FIG. 21 illustrates a block diagram of an example computing environment that can be implemented in conjunction with various embodiments.

With reference to FIG. 21, a suitable environment 2100 for implementing various aspects of the claimed subject matter includes a computer 2102. The computer 2102 includes a processing unit 2104, a system memory 2106, a codec 2135, and a system bus 2108. The system bus 2108 couples system components including, but not limited to, the system memory 2106 to the processing unit 2104. The processing unit 2104 can be any of various available processors. Dual microprocessors and other multiprocessor architectures also can be employed as the processing unit 2104.

The system bus 2108 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 2106 includes volatile memory 2110 and non-volatile memory 2112, which can employ one or more of the disclosed memory architectures, in various embodiments. The basic input/output system (BIOS), containing the basic routines to transfer information between elements within the computer 2102, such as during start-up, is stored in non-volatile memory 2112. In addition, according to present innovations, codec 2135 may include at least one of an encoder or decoder, wherein the at least one of an encoder or decoder may consist of hardware, software, or a combination of hardware and software. Although, codec 2135 is depicted as a separate component, codec 2135 may be contained within non-volatile memory 2112. By way of illustration, and not limitation, non-volatile memory 2112 can include read only memory (ROM), programmable ROM (PROM), electrically programmable ROM (EPROM), electrically erasable programmable ROM (EEPROM), or Flash memory. Non-volatile memory 2112 can employ one or more of the disclosed memory devices, in at least some embodiments. Moreover, non-volatile memory 2112 can be computer memory (e.g., physically integrated with computer 2102 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 2110 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 2102 may also include removable/non-removable, volatile/non-volatile computer storage medium. FIG. 21 illustrates, for example, disk storage 2114. Disk storage 2114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 2114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 2114 to the system bus 2108, a removable or non-removable interface is typically used, such as interface 2116. It is appreciated that storage devices 2114 can store information related to a user. Such information might be stored at or provided to a server or to an application running on a user device. In one embodiment, the user can be notified (e.g., by way of output device(s) 2136) of the types of information that are stored to disk storage 2114 or transmitted to the server or application. The user can be provided the opportunity to opt-in or opt-out of having such information collected or shared with the server or application (e.g., by way of input from input device(s) 2128).

It is to be appreciated that FIG. 21 describes software that acts as an intermediary between users and the basic computer resources described in the suitable operating environment 2100. Such software includes an operating system 2118. Operating system 2118, which can be stored on disk storage 2114, acts to control and allocate resources of the computer system 2102. Applications 2120 take advantage of the management of resources by operating system 2118 through program modules 2124, and program data 2126, such as the boot/shutdown transaction table and the like, stored either in system memory 2106 or on disk storage 2114. It is to be appreciated that the claimed subject matter can be implemented with various operating systems or combinations of operating systems.

A user enters commands or information into the computer 2102 through input device(s) 2128. Input devices 2128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2104 through the system bus 2108 via interface port(s) 2130. Interface port(s) 2130 include, for example, a serial port, a parallel port, a game port, and a universal serial bus (USB). Output device(s) 2136 use some of the same type of ports as input device(s) 2128. Thus, for example, a USB port may be used to provide input to computer 2102 and to output information from computer 2102 to an output device 2136. Output adapter 2134 is provided to illustrate that there are some output devices 2136 like monitors, speakers, and printers, among other output devices 2136, which require special adapters. The output adapters 2134 include, by way of illustration and not limitation, video and sound cards that provide a means of connection between the output device 2136 and the system bus 2108. It should be noted that other devices or systems of devices provide both input and output capabilities such as remote computer(s) 2138.

Computer 2102 can operate in a networked environment using logical connections to one or more remote computers, such as remote computer(s) 2138. The remote computer(s) 2138 can be a personal computer, a server, a router, a network PC, a workstation, a microprocessor based appliance, a peer device, a smart phone, a tablet, or other network node, and typically includes many of the elements described relative to computer 2102. For purposes of brevity, only a memory storage device 2140 is illustrated with remote computer(s) 2138. Remote computer(s) 2138 is logically connected to computer 2102 through a network interface 2142 and then connected via communication connection(s) 2144. Network interface 2142 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 2144 refers to the hardware/software employed to connect the network interface 2142 to the bus 2108. While communication connection 2144 is shown for illustrative clarity inside computer 2102, it can also be external to computer 2102. The hardware/software necessary for connection to the network interface 2142 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

In various embodiments, the voltages applied to the memory device were illustrated to be linear. In other embodiments, the voltages may be non-linear, step-type functions, or the like.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for fabricating a memory device, comprising:
providing a substrate for the memory device;
forming a transistor at least in part within the substrate having a transistor gate;
forming a metal interconnect in electrical contact with the transistor gate;
forming a volatile, two-terminal switching device comprising a first conductive terminal in electrical contact with the metal interconnect, a volatile resistive-switching selector layer overlying the first conductive terminal, and a second conductive terminal overlying the volatile resistive-switching selector layer; and
forming a capacitor having a first terminal electrically connected to the second conductive terminal of the volatile, two-terminal switching device and a second terminal configured to receive an input signal.

2. The method of claim 1, wherein forming the transistor further comprises:
forming a trench within the substrate having a depth and a width, wherein the depth of the trench is greater than the width of the trench;
forming the transistor gate at least in part within the trench within the substrate and at least in part overlying the trench within the substrate, the transistor gate having a width substantially the same as the width of the trench.

3. The method of claim 2, further comprising forming an insulating film overlying a surface of the substrate exposed by the trench within the substrate, wherein the transistor gate is adjacent to the insulating film.

4. The method of claim 2, further comprising forming the trench within the substrate with the depth greater than about 100 nanometers (nm) and with the width less than about 100 nm.

5. The method of claim 2, further comprising forming the trench within the substrate with the depth no less than 200 nm, and with the width of about 55 nm or less.

6. The method of claim 1, wherein forming the capacitor further comprises:
forming an insulator layer overlying the second conductive terminal of the volatile, two-terminal switching device;
forming the second terminal overlying the insulator layer; and
electrically connecting the second terminal to an input node associated with the input signal.

7. The method of claim 1, further comprising forming the first conductive terminal of the volatile, two-terminal switching device from a member selected from a group consisting of: TiN, TaN, Cu, Al, Ag and an alloy of the foregoing.

8. The method of claim 1, further comprising forming the second conductive terminal of the volatile, two-terminal switching device from a member selected from a group consisting of: TiN, TaN, Cu, Al, Ag and an alloy of the foregoing.

9. The method of claim 1, further comprising forming the volatile, resistive-switching selector layer to have few particle trapping voids or defects, and utilizing a material selected from a group consisting of: undoped amorphous Si, a semiconductor having intrinsic characteristics, a Si suboxide, a non stoichiometric Si bearing material and a non-stoichiometric metal oxide.

10. The method of claim 1, further comprising forming a second transistor at least in part within the substrate and having a second channel region connected in series with a first channel region of the transistor, forming a gate for the second transistor, and connecting the gate to a second signal input.

11. A memory device comprising:
a transistor formed at least in part within a dielectric layer or substrate of the memory device, the transistor having a gate with a width less than about 100 nanometers (nm);
a volatile selector device comprising a first metal contact, a volatile switching layer and a second metal contact, wherein the first metal contact is in electrical contact with the gate of the transistor; and
a capacitor structure having a first terminal in electrical contact with the second metal contact of the volatile selector device and a second terminal in electrical contact with a signal input.

12. The memory device of claim 11, wherein the volatile selector device comprises a high resistance state and a low resistance state, and wherein a ratio of the high resistance state compared to the low resistance state is within a range of about $1\times10^9:1$ to about $1\times10^{11}:1$.

13. The memory device of claim 11, further comprising at least one additional transistor coupled to the source or the drain of the transistor, wherein the one additional transistor is configured to electrically couple or electrically decouple the memory device from a sensing circuit.

14. The memory device of claim 11, wherein the transistor is a deep trench transistor.

15. The memory device of claim 14, wherein the deep trench transistor comprises a trench that removes substrate material from the substrate, and a gate material filling at least a part of the trench and at least in part overlying the substrate.

16. The memory device of claim 15, wherein the deep trench transistor further comprises an electrical insulating film overlying an exposed surface of the substrate exposed by the trench.

17. The memory device of claim 14, wherein the deep trench transistor comprises a p-well that is about 55 nm in width, and wherein the gate is substantially 55 nm in width.

18. The memory device of claim 14, wherein the deep trench transistor has a depth of about 200 nm.

19. The memory device of claim 14, wherein the deep trench transistor has an aspect ratio of depth to width of about 4 to about 1.

20. The memory device of claim 14, further comprising:
- a first insulating spacer overlying the substrate and adjacent to a first lateral surface of the gate; and
- a second insulating spacer overlying the substrate and adjacent to a second lateral surface of the gate.

* * * * *